(12) United States Patent
Lin et al.

(10) Patent No.: US 9,299,651 B2
(45) Date of Patent: Mar. 29, 2016

(54) SEMICONDUCTOR ASSEMBLY AND METHOD OF MANUFACTURING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 14/543,037

(22) Filed: Nov. 17, 2014

(65) Prior Publication Data

US 2015/0137338 A1    May 21, 2015

Related U.S. Application Data

(60) Provisional application No. 61/906,596, filed on Nov. 20, 2013.

(51) Int. Cl.
*H01L 23/498* (2006.01)
*H01L 23/544* (2006.01)
(Continued)

(52) U.S. Cl.
CPC ........ *H01L 23/49816* (2013.01); *H01L 21/486* (2013.01); *H01L 23/49827* (2013.01); *H01L 23/5384* (2013.01); *H01L 23/5389* (2013.01); *H01L 23/544* (2013.01); *H01L 23/552* (2013.01); *H01L 24/24* (2013.01); *H01L 24/82* (2013.01); *H01L 24/97* (2013.01); *H01L 21/561* (2013.01); *H01L 21/563* (2013.01); *H01L 23/36* (2013.01); *H01L 23/5383* (2013.01); *H01L 24/13* (2013.01); *H01L 24/16* (2013.01); *H01L 24/32* (2013.01); *H01L 24/81* (2013.01); *H01L 24/92* (2013.01); *H01L 25/0655* (2013.01); *H01L 2223/54426* (2013.01); *H01L 2223/54486* (2013.01); *H01L 2224/0401* (2013.01); *H01L 2224/131* (2013.01); *H01L 2224/13144* (2013.01); *H01L 2224/13147* (2013.01); *H01L 2224/16227* (2013.01); *H01L 2224/16235* (2013.01); *H01L 2224/24227* (2013.01); *H01L 2224/32225* (2013.01); *H01L 2224/32245* (2013.01); *H01L 2224/73204* (2013.01); *H01L 2224/73253* (2013.01);
(Continued)

(58) Field of Classification Search
CPC ................... H01L 23/49816; H01L 23/49827; H01L 23/544; H01L 24/81; H01L 24/83; H01L 24/94; H01L 21/78; H01L 2223/54426; H01L 2224/16227; H01L 2224/32225
See application file for complete search history.

(56) References Cited

U.S. PATENT DOCUMENTS 6,555,906 B2    4/2003    Towle et al.
6,586,822 B1    7/2003    Vu et al.
(Continued)

*Primary Examiner* — Peniel M Gumedzoe
(74) *Attorney, Agent, or Firm* — Pai Patent & Trademark Law Firm; Chao-Chang David Pai

(57) ABSTRACT

A method of making a semiconductor assembly is characterized by the step of attaching a chip-on-interposer subassembly on a base carrier with the chip inserted into a through opening of the base carrier and the interposer laterally extending beyond the through opening. The base carrier provides a platform for the chip-on-interposer subassembly attachment, whereas the interposer provides primary fan-out routing for the chip. In the method, a buildup circuitry is electrically coupled to the interposer and an optional cover sheet or additional buildup circuitry can be provided on the chip.

13 Claims, 17 Drawing Sheets

(51) Int. Cl.

| | |
|---|---|
| *H01L 23/00* | (2006.01) |
| *H01L 21/78* | (2006.01) |
| *H01L 21/48* | (2006.01) |
| *H01L 23/552* | (2006.01) |
| *H01L 23/36* | (2006.01) |
| *H01L 21/56* | (2006.01) |
| *H01L 23/538* | (2006.01) |
| *H01L 25/065* | (2006.01) |

(52) U.S. Cl.
CPC ............ *H01L 2224/73259* (2013.01); *H01L 2224/81191* (2013.01); *H01L 2224/81203* (2013.01); *H01L 2224/81207* (2013.01); *H01L 2224/81815* (2013.01); *H01L 2224/92125* (2013.01); *H01L 2224/92224* (2013.01); *H01L 2224/92225* (2013.01); *H01L 2224/97* (2013.01); *H01L 2924/12042* (2013.01); *H01L 2924/157* (2013.01); *H01L 2924/1531* (2013.01); *H01L 2924/1579* (2013.01); *H01L 2924/15192* (2013.01); *H01L 2924/15787* (2013.01); *H01L 2924/15788* (2013.01); *H01L 2924/15793* (2013.01); *H01L 2924/18161* (2013.01)

(56) References Cited

U.S. PATENT DOCUMENTS

| | | | |
|---|---|---|---|
| 6,734,534 | B1 | 5/2004 | Vu et al. |
| 6,825,063 | B2 | 11/2004 | Vu et al. |
| 7,405,103 | B2 | 7/2008 | Chang |
| 7,768,119 | B2 | 8/2010 | Chia |
| 7,829,987 | B2 | 11/2010 | Chia |
| 7,880,296 | B2 | 2/2011 | Wong et al. |
| 8,035,127 | B2 | 10/2011 | Chia et al. |
| 8,058,718 | B2 | 11/2011 | Hsu et al. |
| 2011/0169170 | A1* | 7/2011 | Baba ............... H01L 23/49827 257/774 |
| 2011/0244636 | A1* | 10/2011 | Kondo ............. H01L 23/49822 438/127 |
| 2014/0048951 | A1* | 2/2014 | Lin ..................... H01L 23/481 257/774 |

* cited by examiner

SEMICONDUCTOR ASSEMBLY AND METHOD OF MANUFACTURING THE SAME

CROSS REFERENCE TO RELATED APPLICATIONS

This application claims the benefit of filing date of U.S. Provisional Application Ser. No. 61/906,596 filed Nov. 20, 2013. The entirety of said Provisional Application is incorporated herein by reference.

FIELD OF THE INVENTION

The present invention relates to a semiconductor assembly, more particularly, to a semiconductor assembly having a semiconductor device positioned in a through opening of a base carrier and electrically connected to an interposer, and a method of making the same.

DESCRIPTION OF RELATED ART

The convergence of mobility, communication, and computing has created significant thermal, electrical and reliability challenges to the semiconductor packaging industry. Despite numerous configurations for embedding semiconductor chip in a wiring board reported in the literature, many manufacturing and performance-related deficiencies remain. For example, U.S. Pat. Nos. 6,555,906, 6,586,822 6,734,534, 6,825,063, 7,405,103, 7,768,119 and 7,829,987 disclose semiconductor assemblies having a semiconductor chip disposed in an opening of a core board and electrically connected to a build-up circuitry through a micro-via connection on the chip I/O pad. However, with the advances of chip fabrication technologies, the number of I/O pads steadily increases and the I/O pad spacing (pitch) decreases accordingly. The use of micro-via can create crowding problem which causes shorting between the neighboring micro-vias.

Another significant drawback arising from the fabrication of the above assemblies is that the embedded chip may dislocate during chip inserting. Incomplete metallization of micro-vias due to chip dislocation disclosed in U.S. Pat. Nos. 7,880,296, 8,058,718, and 8,035,127 may further degrade the quality of the electrical connection, thereby lowering the reliability and production yield of the fabricated assembly.

For the reasons stated above, and for other reasons stated below, an urgent need exists to develop a new apparatus and method to interconnect chip disposed in a through opening of a core board without using micro-via at chip I/O pad to improve chip-level reliability and manufacturing yield.

SUMMARY OF THE INVENTION

A primary objective of the present invention is to provide a semiconductor assembly in which a chip-on-interposer subassembly is configured wherein a chip or a 3D-stacked chip is assembled to a interposer by a plurality of bumps so as to avoid laser or photo-imaging process directly acting on chip I/O pads, thereby improving the production yield and reliability of the semiconductor assembly.

Another objective of the present invention is to provide a semiconductor assembly in which an interposer is used to provide fan-out routing for the chip attached thereon. As the chip is electrically connected to one side of the interposer for fan-out through the interposer, a buildup circuitry can be connected to another side of the interposer with much larger contact pad pitch, thereby resolving chip I/O pad crowding problem and improving the production yield and reliability of the semiconductor assembly.

Yet another objective of the present invention is to provide a semiconductor assembly in which a base carrier is used to serve as a platform for chip-on-interposer attachment with the chip inserted in a through opening of the base carrier and the interposer located against the base carrier and beyond the through opening so as to provide adequate mechanical support for the inserted chip before disposing buildup circuitry.

In accordance with the foregoing and other objectives, the present invention proposes a semiconductor assembly that includes a semiconductor device, an interposer, an adhesive, a base carrier and a buildup circuitry. The interposer, interconnected to the semiconductor device by bumps, provides primary fan-out routing for the semiconductor device so that the possible bond pad disconnection induced by tight I/O pad pitch can be avoided. The base carrier, having a through opening, provides a platform for attaching the interposer thereon by the adhesive with the semiconductor device positioned in and exposed from the through opening. The buildup circuitry, adjacent to the base carrier and the interposer and electrically connected to the interposer, provides secondary fan-out routing for the semiconductor device and has a patterned array of terminal pads that matches the next level assembly wiring board. Optionally, the semiconductor assembly may further include a cover sheet or an additional buildup circuitry on the exposed semiconductor device.

In one aspect, the present invention provides a method of making a semiconductor assembly, including the steps of: providing a semiconductor device; providing an interposer that includes a first surface, a second surface opposite to the first surface, first contact pads on the first surface, second contact pads on the second surface, and through vias that electrically couple the first contact pads and the second contact pads; electrically coupling the semiconductor device to the second contact pads of the interposer by a plurality of bumps to form a chip-on-interposer subassembly; providing a base carrier having a first surface, an opposite second surface, and a through opening that extends through the base carrier between the first surface and the second surface thereof; attaching the chip-on-interposer subassembly to the base carrier using an adhesive with the semiconductor device inserted into the through opening and the interposer laterally extending beyond the through opening; with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry; and optionally attaching a cover sheet on the semiconductor device and the second surface of the base carrier, or forming a second buildup circuitry on the semiconductor device and the second surface of the base carrier.

Unless specific descriptions or steps necessarily occur in a certain order, the sequence of the above-mentioned steps is not limited to that set forth above and may be changed or reordered according to desired design.

In another aspect, the present invention provides a semiconductor assembly, including a semiconductor device, an interposer, a base carrier, a first buildup circuitry, and optionally a cover sheet or a second buildup circuitry, wherein (i) the interposer has a first surface, a second surface opposite to the first surface, first contact pads on the first surface, second contact pads on the second surface, and through vias that electrically couple the first contact pads and the second contact pads; (ii) the semiconductor device is electrically coupled to the second contact pads of the interposer by a plurality of bumps to form a chip-on-interposer subassembly; (iii) the base carrier has a first surface, an opposite second surface, and a through opening that extends through the base carrier between the first surface and the second surface thereof; (iv) the chip-on-interposer subassembly is attached to the base carrier using an adhesive with the semiconductor device inserted into the through opening and the interposer laterally extending beyond the through opening; (v) the first buildup circuitry is formed on the first surface of the interposer and the first surface of the base carrier and is electrically coupled to the first contact pads of the interposer through first conductive vias of the first buildup circuitry; and (vi) the optional cover sheet is attached on the semiconductor device and the second surface of the base carrier, or the optional second buildup circuitry is formed on the semiconductor device and the second surface of the base carrier.

The method of making a semiconductor assembly according to the present invention has numerous advantages. For instance, forming the chip-on-interposer subassembly before attaching it to the base carrier can ensure the semiconductor device is electrically connected so that any contact pad disconnection problem inherent to micro-via process can be avoided. Inserting the semiconductor device to the through opening by the chip-on-interposer subassembly is particularly advantageous as the shape of the through opening would not be a critical parameter that needs to be tightly controlled. Additionally, the two-step forming of the interconnect substrate for the semiconductor device is beneficial as the interposer can provide primary fan-out routing whereas the buildup circuitry provide further fan-out routing and horizontal interconnections between the upper and the lower assemblies.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-17 are schematic views showing a method of making a semiconductor assembly, which includes an interposer, semiconductor devices, a base carrier and a buildup circuitry in accordance with an embodiment of the present invention.

Figure 17:
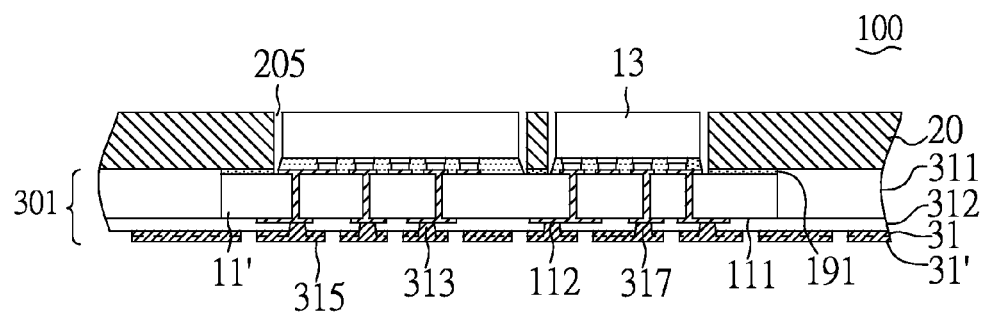
FIG. 17 is a cross-sectional view showing a state in which the structure of FIG. 16 is provided with conductive traces to finish the fabrication of a semiconductor assembly in accordance with the first embodiment of the present invention.

As shown in FIG. 17, the semiconductor assembly 100 includes an interposer 11', semiconductor devices 13, a base carrier 20 and a buildup circuitry 301. The interposer 11' and the semiconductor devices 13 are attached to the base carrier 20 using an adhesive 191, with the semiconductor devices 13 positioned in through holes 205 of the base carrier 20. The buildup circuitry 301 covers the interposer 11' and the base carrier 20 from the lower side and is electrically coupled to first contact pads 112 of the interposer 11' through first conductive vias 317.

FIGS. 1, 3, 4, 6 and 8 are cross-sectional views showing a process of fabricating chip-on-interposer subassemblies in accordance with an embodiment of the present invention, and FIGS. 2, 5, 7 and 9 are top perspective views corresponding to FIGS. 1, 4, 6 and 8, respectively.

Figure 1:
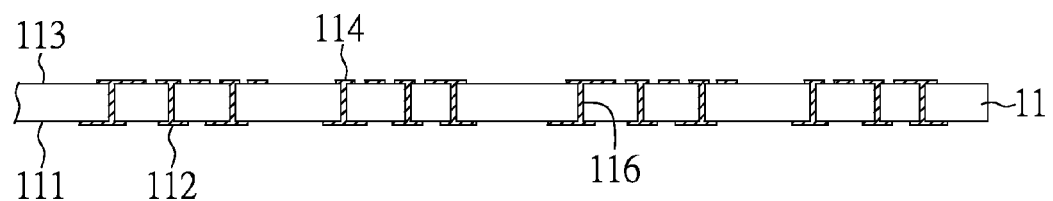
FIGS. 1 and 2 are cross-sectional and top perspective views, respectively, of an interposer panel in accordance with the first embodiment of the present invention.
Figure 2:
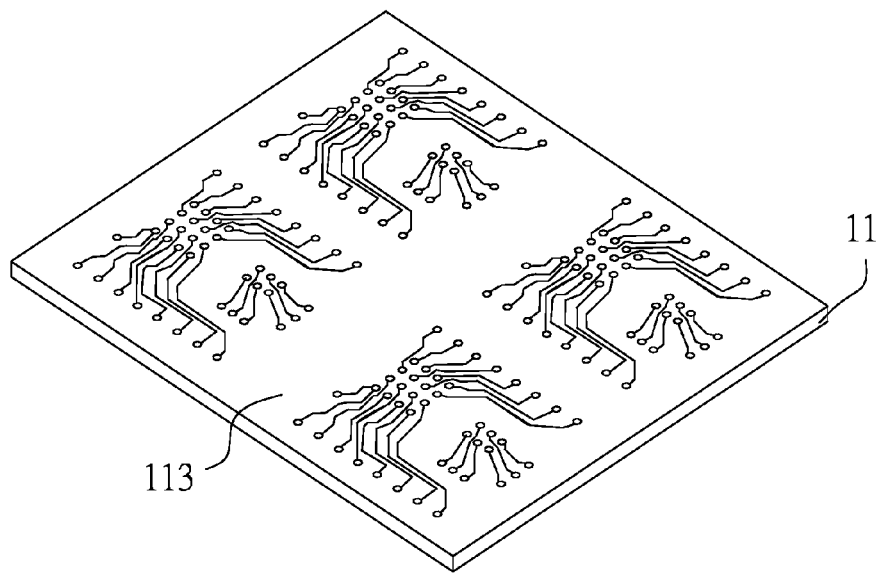

FIGS. 1 and 2 are cross-sectional and top perspective views, respectively, of an interposer panel 11, which includes a first surface 111, a second surface 113 opposite to the first surface 111, first contact pads 112 on the first surface 111, second contact pads 114 on the second surface 113, and through vias 116 that electrically couple the first contact pads 112 and the second contact pads 114. The interposer panel 11 can be a silicon, glass, ceramic, graphite or resin interposer that contains a pattern of traces that fan out from a finer pitch at the second contact pads 114 to a coarser pitch at the first contact pads 112.

Figure 3:
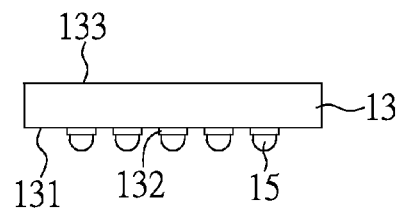
FIG. 3 is a cross-sectional view of a chip with bumps mounted thereon in accordance with the first embodiment of the present invention.

FIG. 3 is a cross-sectional view of a semiconductor device 13 with bumps 15 mounted thereon. In this embodiment, the semiconductor device 13 is a chip and includes an active surface 131, an inactive surface 133 opposite to the active surface 131, and I/O pads 132 on the active surface 131. The bumps 15 are mounted on the I/O pads 132 of the semiconductor device 13 and may be solder, gold or copper pillars.

Figure 4:
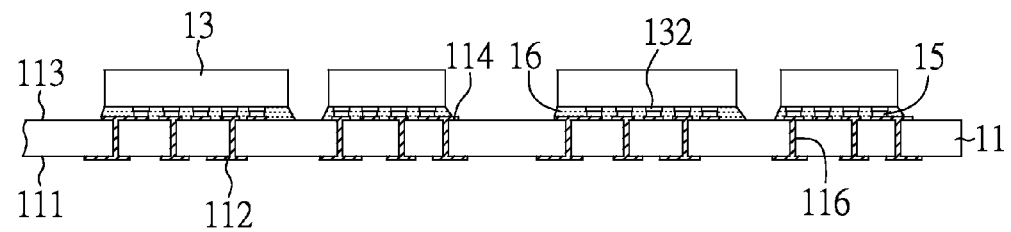
FIGS. 4 and 5 are cross-sectional and top perspective views, respectively, of a panel-scale assembly with the chips of FIG. 3 electrically coupled to the interposer panel of FIGS. 1 and 2 in accordance with the first embodiment of the present invention.
Figure 5:
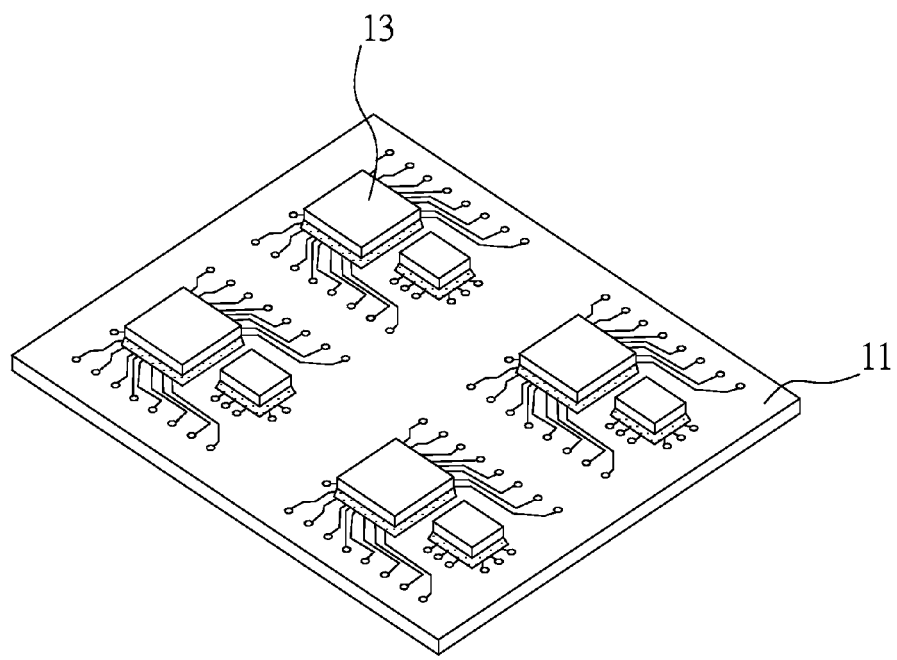

FIGS. 4 and 5 are cross-sectional and top perspective views, respectively, of the panel-scale assembly with the semiconductor devices 13 electrically coupled to the interposer panel 11. The semiconductor devices 13 can be electrically coupled to the second contact pads 114 of the interposer panel 11 using the bumps 15 by thermal compression, solder reflow or thermosonic bonding. As an alternative, the bumps 15 may be first deposited on the second contact pads 114 of the interposer panel 11, and then the semiconductor devices 13 are electrically coupled to the interposer panel 11 by the bumps 15. Optionally, underfill 16 can be further provided to fill the gap between the interposer panel 11 and the semiconductor devices 13.

Figure 6:
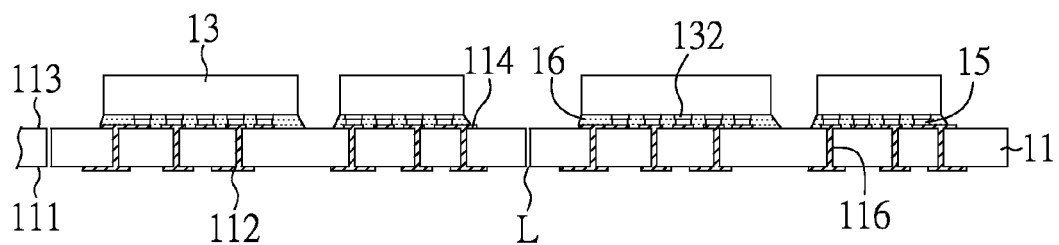
FIGS. 6 and 7 are cross-sectional and top perspective views, respectively, of a diced state of the panel-scale assembly of FIGS. 4 and 5 in accordance with the first embodiment of the present invention.
Figure 7:
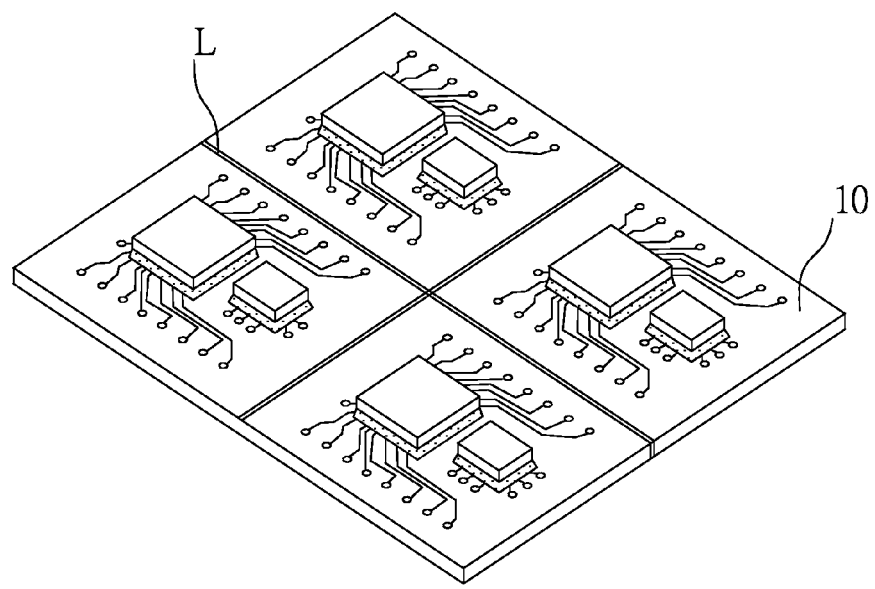

FIGS. 6 and 7 are cross-sectional and top perspective views, respectively, of the panel-scale assembly diced into individual pieces. The panel-scale assembly is singulated into individual chip-on-interposer subassembly 10 along dicing lines "L".

Figure 8:
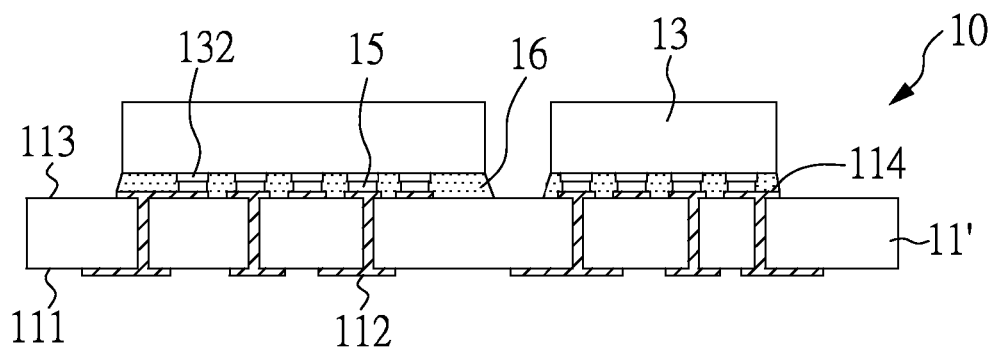
FIGS. 8 and 9 are cross-sectional and top perspective views, respectively, of a chip-on-interposer subassembly corresponding to a diced unit in FIGS. 6 and 7 in accordance with the first embodiment of the present invention.
Figure 9:
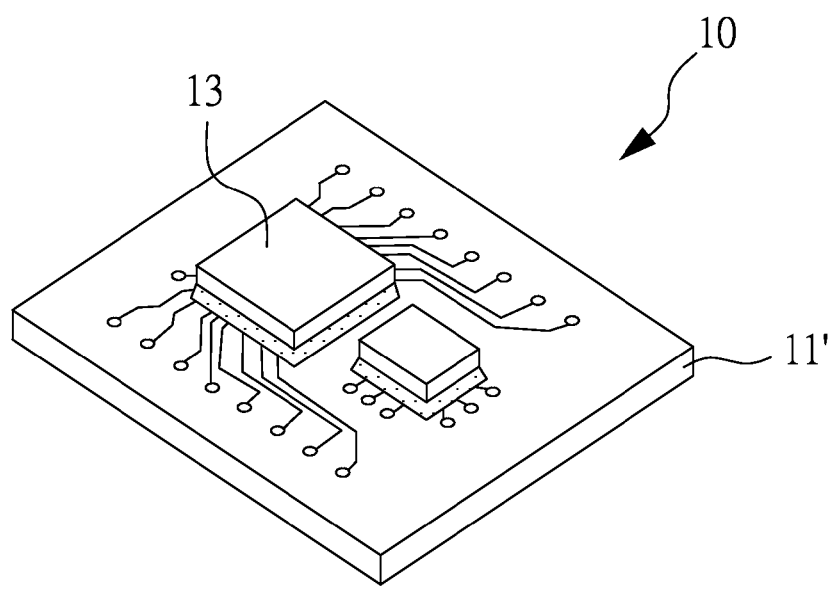

FIGS. 8 and 9 are cross-sectional and top perspective views, respectively, of the individual chip-on-interposer subassembly 10. In this illustration, the chip-on-interposer subassembly 10 includes two semiconductor devices 13 electrically coupled on the diced interposer 11'. As the size and pad spacing of the first contact pads 112 of the interposer 11' are designed to be larger than those of the chip I/O pads 132, the interposer 11' can provide a primary fan-out routing for the semiconductor devices 13 so as to ensure a higher manufacturing yield for the next level buildup circuitry interconnection. Furthermore, the interposer 11' also provides primary electrical connections between adjoining semiconductor devices 13 prior to interconnecting to the next level interconnection structure.

Figure 10:
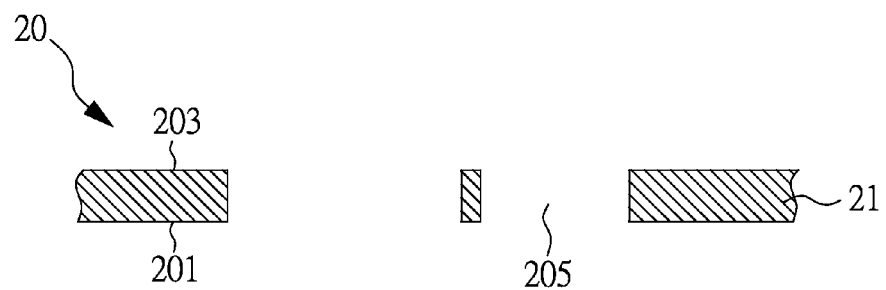
FIGS. 10 and 11 are cross-sectional and bottom perspective views, respectively, of a base carrier in accordance with the first embodiment of the present invention.
Figure 11:
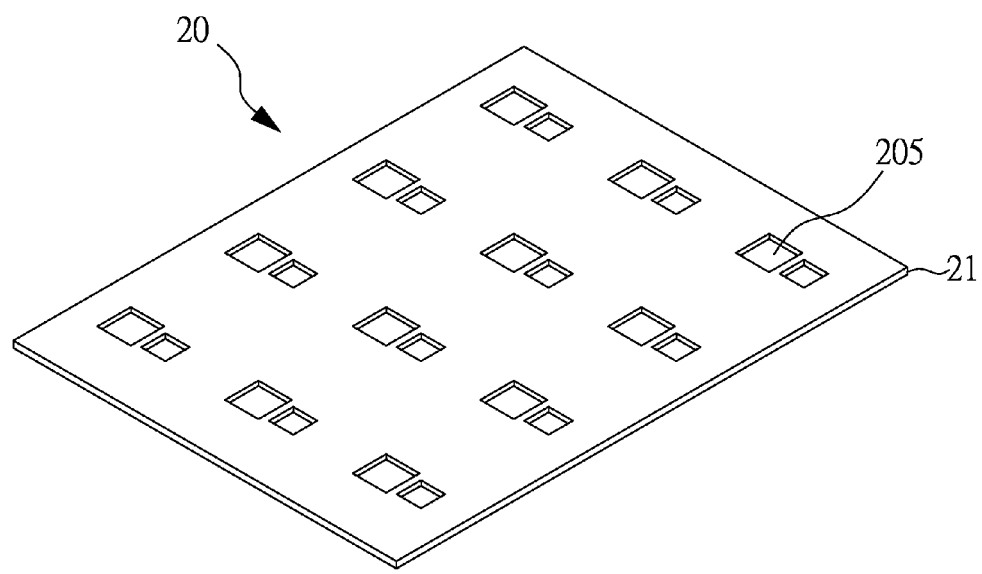

FIGS. 10 and 11 are cross-sectional and bottom perspective views, respectively, of a base carrier 20 with a first surface 201, an opposite second surface 203, and through openings 205 that extend through the base carrier 20 between the first surface 201 and the second surface 203 in the vertical direction. The base carrier 20 can be provided by forming the through openings 205 in a metal plate 21. The metal plate 21 can have a thickness of 0.1 mm to 1 mm, and may be made of copper, aluminum, stainless steel or their alloys. Also, the base carrier 20 may be made of non-metallic materials. In this embodiment, the metal plate 21 is a copper sheet with a thickness of 0.15 mm which is close to the combined thickness of the 0.1 mm chip and the 0.05 mm conductive bump. The through openings 205 can be formed by mechanical drilling or etching and each of them can have a different size. In this embodiment, the through openings 205 each have a dimension that is essentially the same or slightly larger than the subsequently disposed semiconductor device.

Figure 12:
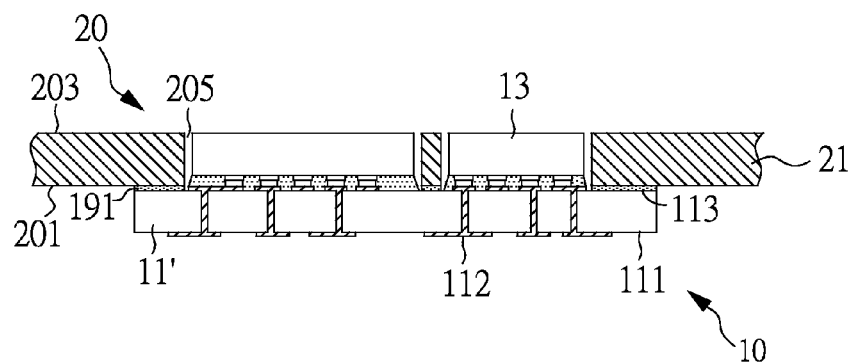
FIGS. 12 and 13 are cross-sectional and bottom perspective views, respectively, showing a state in which the chip-on-interposer subassemblies of FIGS. 8 and 9 are attached to the base carrier of FIGS. 10 and 11 in accordance with the first embodiment of the present invention.
Figure 13:
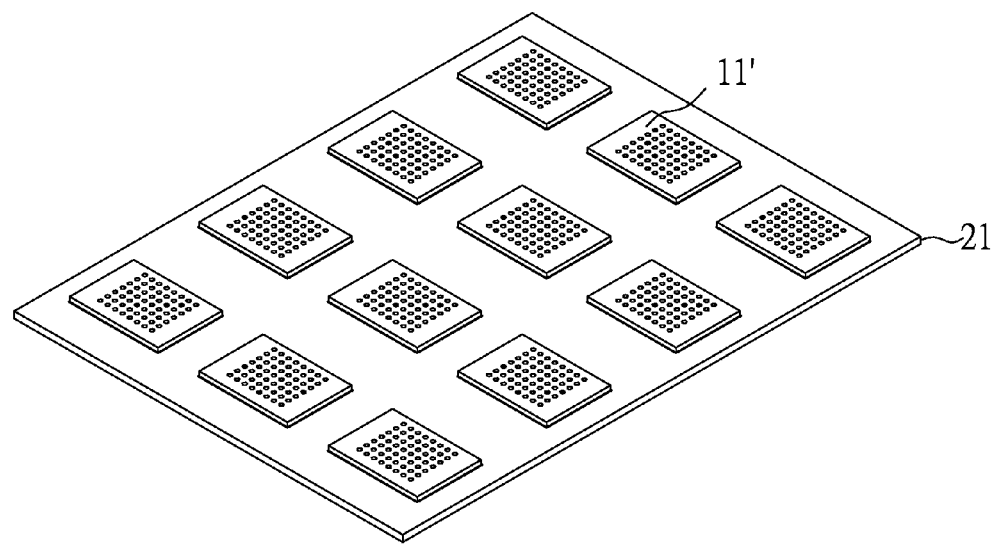

FIGS. 12 and 13 are cross-sectional and bottom perspective views, respectively, of the structure of the chip-on-interposer subassemblies 10 attached to the base carrier 20 using an adhesive 191 that is disposed between and contacts the first surface 201 of the base carrier 20 and the second surface 113 of the interposer 11'. The semiconductor devices 13 are inserted into the through openings 205, and the interposers 11' are located beyond the through openings 205 and spaced from the peripheral edges of the base carrier 20.

Figure 14:
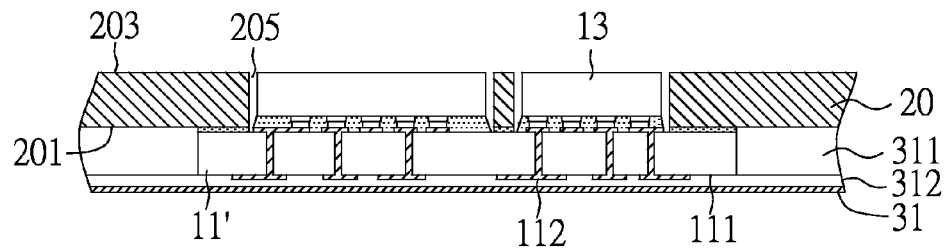
FIGS. 14 and 15 are cross-sectional and bottom perspective views, respectively, showing a state in which laminated layers are disposed on the structure of FIGS. 12 and 13 in accordance with the first embodiment of the present invention.
Figure 15:
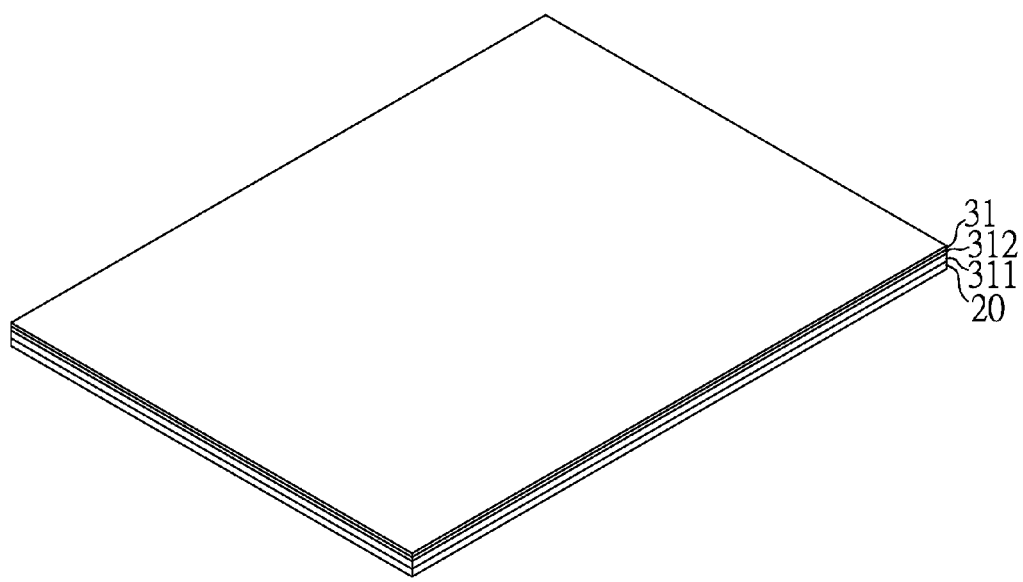

FIGS. 14 and 15 are cross-sectional and bottom perspective views, respectively, of the structure with a balancing layer 311, an insulating layer 312 and a metal sheet 31 laminated/coated on the interposers 11' and the base carrier 20 from below. The balancing layer 311 contacts and extends from the base carrier 20 in the downward direction and laterally covers and surrounds and conformally coats the sidewalls of the interposers 11' and extends laterally from the interposers 11' to the peripheral edges of the structure. The insulating layer 312 contacts and covers and extends laterally on the first surface 111 of the interposers 11' and the balancing layer 311 in the downward direction. The metal sheet 31 contacts and covers the insulating layer 312 from below. In this embodiment, the balancing layer 311 has a thickness of 0.2 mm which is close to the thickness of the interposer 11', and the insulating layer 312 typically has a thickness of 50 microns. The balancing layer 311 and the insulating layer 312 can be made of epoxy resin, glass-epoxy, polyimide, and the like. The metal sheet 31 in this embodiment is a copper layer with a thickness of 25 microns.

Figure 16:
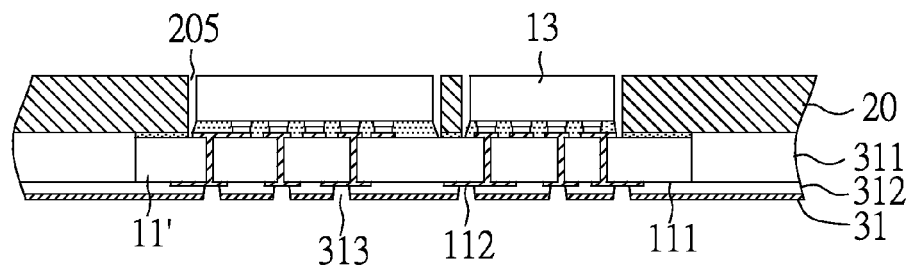
FIG. 16 is a cross-sectional view showing a state in which the structure of FIG. 14 is provided with via openings in accordance with the first embodiment of the present invention.

FIG. 16 is a cross-sectional view of the structure provided with via openings 313. The via openings 313 extend through the metal sheet 31 and the insulating layer 312 and are aligned with the first contact pads 112 of the interposer 11'. The via openings 313 may be formed by numerous techniques including laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser.

Referring now to FIG. 17, conductive traces 315 are formed on the insulating layer 312 by depositing a plated layer 31' on the metal sheet 31 and into the via openings 313 and then patterning the metal sheet 31 as well as the plated layer 31' thereon. Alternatively, when no metal sheet 31 is laminated on the insulating layer 312 in the previous process, the insulating layer 312 can be directly metallized to form the conductive traces 315. The conductive traces 315 extend from the first contact pads 112 of the interposer 11' in the downward direction, extend laterally on the insulating layer 312 and extend into and fill up the via openings 313 to form the conductive vias 317 in direct contact with the first contact pads 112 of the interposer 11'. As a result, the conductive traces 315 can provide horizontal signal routing in both the X and Y directions and vertical routing through the via openings 313 and serve as electrical connections for the interposer 11'.

The plated layer 31' can be deposited by any of numerous techniques including electroplating, electroless plating, evaporating, sputtering, and their combinations, as a single layer or multiple layers. For instance, they can be deposited by first dipping the structure in an activator solution to render the insulating layer 312 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the conductive traces 315 by any of numerous techniques including wet etching, electro-chemical etching, laser-assist etching, and their combinations, with an etch masks (not shown) thereon that define the conductive traces 315.

The metal sheet 31 and the plated layer 31' are shown as a single layer for convenience of illustration. The boundary (shown in broken lines) between the metal layers may be difficult or impossible to detect since copper is plated on copper.

Accordingly, as shown in FIG. 17, a semiconductor assembly 100 is accomplished and includes an interposer 11', semiconductor devices 13, a base carrier 20 and a buildup circuitry 301. In this illustration, the buildup circuitry 301 includes a balancing layer 311, an insulating layer 312 and conductive traces 315. The semiconductor devices 13 are electrically coupled to the pre-fabricated interposer 11' by flip chip process to form a chip-on-interposer subassembly 10. The chip-on-interposer subassembly 10 is attached to the base carrier 20 using an adhesive 191 with the semiconductor devices 13 positioned within the through openings 205. The semiconductor devices 13 in the through openings 205 are exposed from above, and the interposer 11' laterally extends beyond the through openings 205. The buildup circuitry 301 is electrically coupled to the interposer 11' through the conductive vias 317 in direct contact with the first contact pads 112 of the interposer 11', and thus the electrical connection between the interposer 11' and the buildup circuitry 301 is devoid of soldering material.

Embodiment 2

FIGS. 18-23 are schematic views showing a method of making another semiconductor assembly which has a registration mark for interposer attachment and a cover sheet for heat dissipation of the semiconductor devices in accordance with another embodiment of the present invention.

For purposes of brevity, any description in Embodiment 1 above is incorporated herein insofar as the same is applicable, and the same description need not be repeated.

Figure 18:
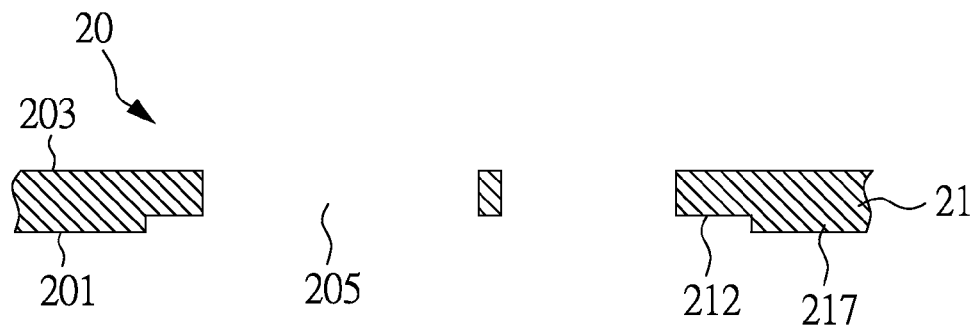
FIG. 18 is a cross-sectional view showing a base carrier in accordance with the second embodiment of the present invention.

FIG. 18 is a cross-sectional view of a base carrier 20 having a registration mark 217 and through openings 205. The registration mark 217 can be formed by removing selected portions of a metal plate 21 or by pattern deposition of a metal or plastic material on the metal plate 21 at the first surface 201. Plating, etching or mechanical carving is typically used to form the registration mark 217. Accordingly, the registration mark 217 extends from the flat surface 212 of the base carrier 20 in the downward direction and can have a thickness of 5 to 200 microns. In this embodiment, the registration mark 217 with a thickness of 50 microns laterally extends to the peripheral edges of the base carrier 20 and has inner peripheral edges that conform to the four lateral sides of a subsequently disposed interposer.

Figure 19:
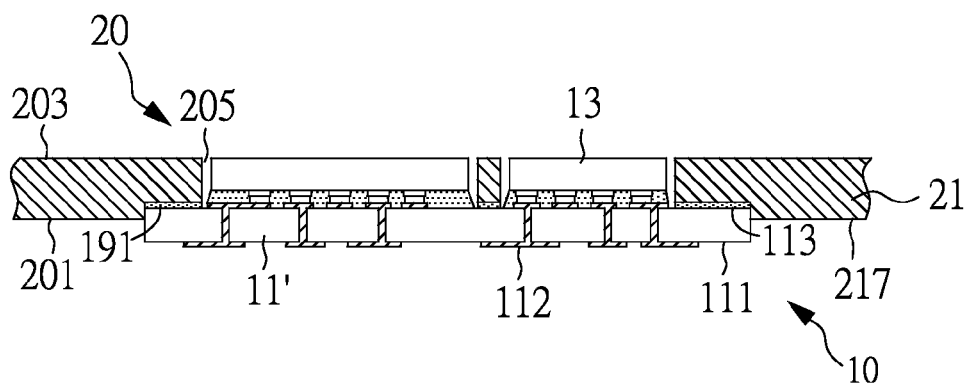
FIG. 19 is a cross-sectional view showing a state in which the chip-on-interposer subassembly of FIG. 8 is attached to the base carrier of FIG. 18 in accordance with the second embodiment of the present invention.

FIG. 19 is a cross-sectional view of the structure with the chip-on-interposer subassembly 10 of FIG. 8 attached to the base carrier 20 using an adhesive 191. The interposer 11' and the semiconductor devices 13 are attached to the base carrier 20 with the semiconductor devices 13 inserted into the through openings 205 and the registration mark 217 laterally aligned with and in close proximity to the peripheral edges of the interposer 11'. The interposer placement accuracy is provided by the registration mark 217. The registration mark 217 extends beyond the second surface 113 of the interposer 11' in the downward direction and is located beyond and laterally aligned with the four lateral surfaces of the interposer 11' in the lateral directions. As the registration mark 217 is in close proximity to and conforms to the four lateral surfaces of the interposer 11' in lateral directions, any undesirable movement of the chip-on-interposer subassembly 10 due to adhesive curing can be avoided. Preferably, a gap in between the interposer 11' and the registration mark 217 is in a range of about 5 to 50 microns. The chip-on-interposer subassembly 10 can also be attached without the registration mark 217. Although the through openings 205 cannot provide placement accuracy for the chip-on-interposer subassembly 10, it does not result in micro-via connection failure in the subsequent process of forming buildup circuitry on interposer 11' due to the larger pad size and pitch of the interposer 11'.

Figure 20:
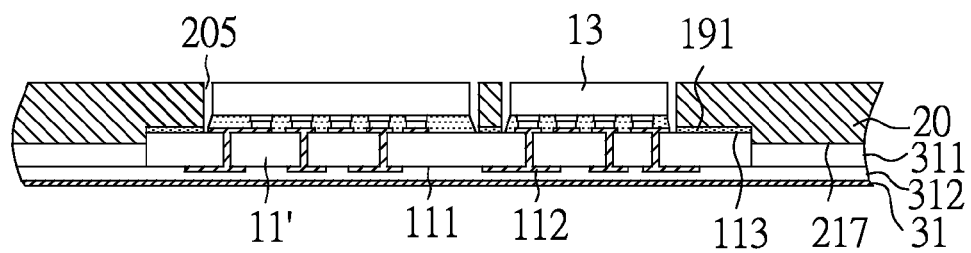
FIG. 20 is a cross-sectional view showing a state in which laminated layers are disposed on the structure of FIG. 19 in accordance with the second embodiment of the present invention.

FIG. 20 is a cross-sectional view of the structure with a balancing layer 311, an insulating layer 312 and a metal sheet 31 laminated/coated on the interposer 11' and the base carrier 20 from below. The balancing layer 311 contacts and extends from the base carrier 20 in the downward direction and laterally covers and surrounds and conformally coats the sidewalls of the interposer 11' and extends laterally from the interposer 11' to the peripheral edges of the structure. The insulating layer 312 contacts and provides robust mechanical bonds between the metal sheet 31 and the interposer 11' and between the metal sheet 31 and the balancing layer 311.

Figure 21:
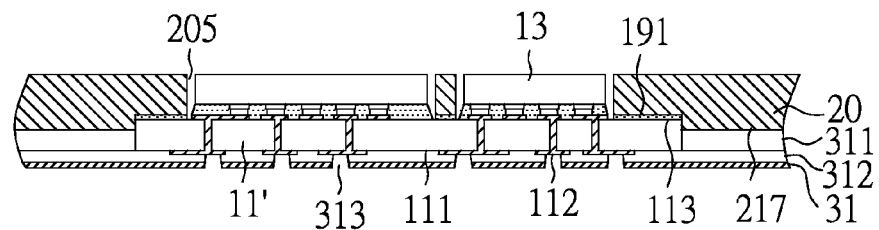
FIG. 21 is a cross-sectional view showing a state in which the structure of FIG. 20 is provided with via openings in accordance with the second embodiment of the present invention.

FIG. 21 is a cross-sectional view of the structure provided with via openings 313. The via openings 313 extend through the metal sheet 31 and the insulating layer 312 and are aligned with the first contact pads 112 of the interposer 11'.

Figure 22:
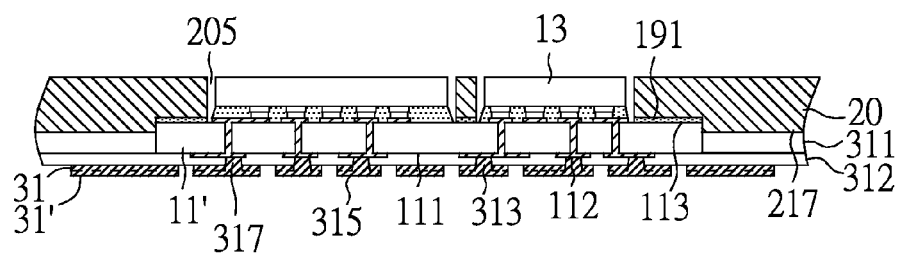
FIG. 22 is a cross-sectional view showing a state in which the structure of FIG. 21 is provided with conductive traces in accordance with the second embodiment of the present invention.

FIG. 22 is a cross-sectional view of the structure provided with conductive traces 315 on the insulating layer 312 by depositing a plated layer 31' on the metal sheet 31 and into the via openings 313 and then patterning the metal sheet 31 as well as the plated layer 31' thereon. The conductive traces 315 extend from the first contact pads 112 of the interposer 11' in the downward direction, extend laterally on the insulating layer 312 and extend into and fill up the via openings 313 to form conductive vias 317 in direct contact with the first contact pads 112 of the interposer 11', thereby providing signal routings for the interposer 11'.

Figure 23:
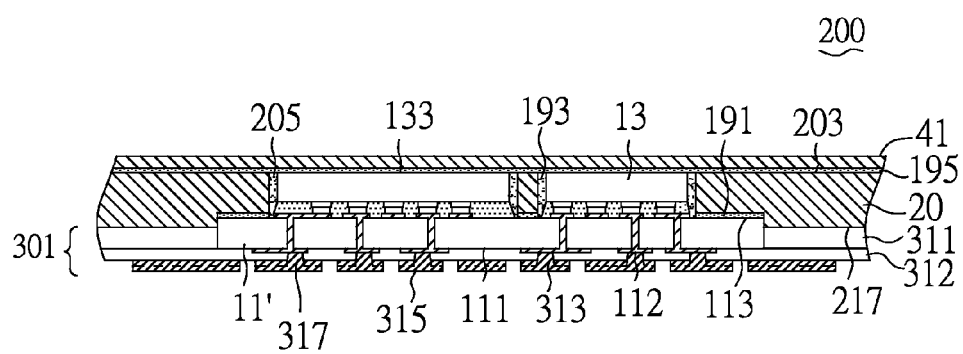
FIG. 23 is a cross-sectional view showing a state in which the structure of FIG. 22 is provided with a cover sheet to finish the fabrication of a semiconductor assembly in accordance with the second embodiment of the present invention.

Referring now to FIG. 23, a filler material 193 is dispensed in the remaining space of the through openings 205 and a cover sheet 41 is attached to the semiconductor devices 13 and the base carrier 20. The filler material 193 surrounds the semiconductor devices 13 and is essentially coplanar with the semiconductor devices 13 and the base carrier 20 in the upward direction. Subsequently, the cover sheet 41 is mounted on the inactive surface 133 of the semiconductor devices 13 and the second surface 203 of the base carrier 20 using an adhesive 195. The cover sheet 41 can be a metal sheet made of copper, aluminum, stainless steel or their alloys and serves as a heat spreader. In this case, the adhesive 195 typically is a thermally conductive adhesive. Alternatively, for non-thermal enhanced cases, the cover sheet 41 may be made of transparent materials or color changing materials for optical devices such as LEDs or imaging sensors. In this embodiment, the cover sheet 41 serving as a heat spreader is a copper sheet with a thickness of 1 mm.

Accordingly, as shown in FIG. 23, a semiconductor assembly 200 is accomplished and includes an interposer 11', semiconductor devices 13, a base carrier 20, a buildup circuitry 301 and a cover sheet 41. The semiconductor devices 13 are electrically coupled to the pre-fabricated interposer 11' by flip chip process to form a chip-on-interposer subassembly 10. The chip-on-interposer subassembly 10 is attached to the base carrier 20 using an adhesive 191 with the semiconductor devices 13 positioned within the through openings 205 and the interposer 11' laterally extending beyond the through openings 205. The semiconductor devices 13 and the base carrier 20 are covered by and thermally conductible to the cover sheet 41. The registration mark 217 of the base carrier 20 extends beyond the second surface 113 of the interposer 11' in the downward direction and is in close proximity to the peripheral edges of the interposer 11' to provide critical placement accuracy for the interposer 11'. The buildup circuitry 301 is electrically coupled to the interposer 11' through the conductive vias 317 in direct contact with the first contact pads 112 of the interposer 11'.

Embodiment 3

FIGS. 24-32 are schematic views showing a method of making yet another semiconductor assembly which includes an additional buildup circuitry thermally conductible to the semiconductor device and electrically coupled to the base carrier in accordance with yet another embodiment of the present invention.

For purposes of brevity, any description in the aforementioned Embodiments is incorporated herein insofar as the same is applicable, and the same description need not be repeated.

Figure 24:
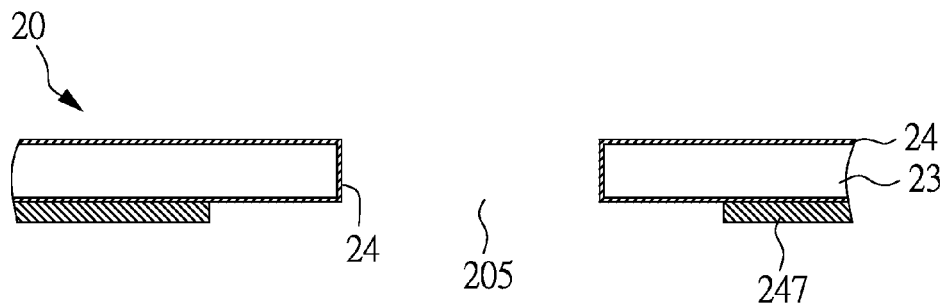
FIG. 24 is a cross-sectional view showing a base carrier in accordance with the third embodiment of the present invention.

FIG. 24 is a cross-sectional view of a base carrier 20 having a through opening 205 and a registration mark 247. In this illustration, the base carrier 20 has a conductive layer 24 on the sidewalls of the through opening 205 as well as on both opposite surfaces of a dielectric layer 23 with a thickness of about 0.5 mm. The registration mark 247 can be formed on the lower part of the conductive layer 24 by pattern deposition, including electroplating, electroless plating, evaporating, sputtering and their combinations using photolithographic process. In this embodiment, the registration mark 247 laterally extends to the peripheral edges of the base carrier 20 and has inner peripheral edges that conform to the four lateral sides of a subsequently disposed interposer.

Figure 25:
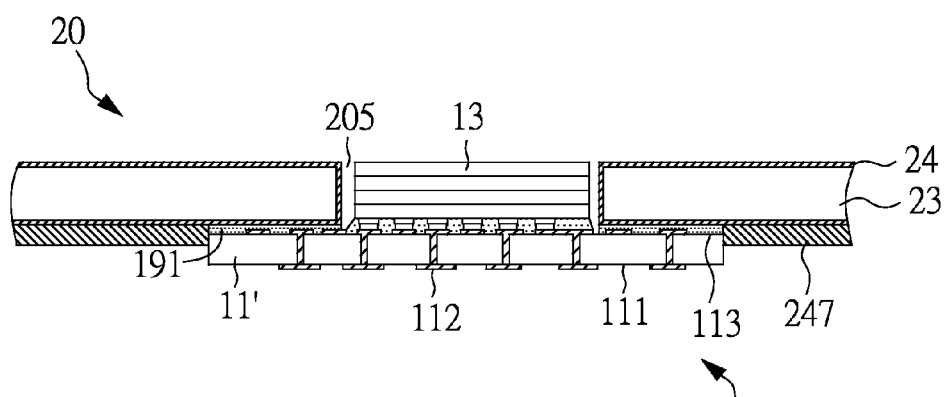
FIG. 25 is a cross-sectional view showing a state in which a chip-on-interposer subassembly is attached to the base carrier of FIG. 24 in accordance with the third embodiment of the present invention.

FIG. 25 is a cross-sectional view of the structure with a chip-on-interposer subassembly 10 attached to the base carrier 20 using an adhesive 191. The chip-on-interposer subassembly 10 is similar to that illustrated in FIG. 8, except that a single semiconductor device 13, illustrated as a 3D-stacked chip, is flip mounted on the interposer 11' in this embodiment. The interposer 11' and the semiconductor device 13 are attached to the base carrier 20 with the semiconductor device 13 inserted into the through opening 205 and the registration mark 247 laterally aligned with and in close proximity to the peripheral edges of the interposer 11'. The adhesive 191 contacts and is disposed between the second surface 113 of the interposer 11' and the lower part of the conductive layer 24 of the base carrier 20, thereby providing mechanical bonds between the interposer 11' and the base carrier 20. The registration mark 247 extends beyond the second surface 113 of the interposer 11' in the downward direction and is in close proximity to the peripheral edges of the interposer 11' to provide critical placement accuracy for the interposer 11'.

Figure 26:
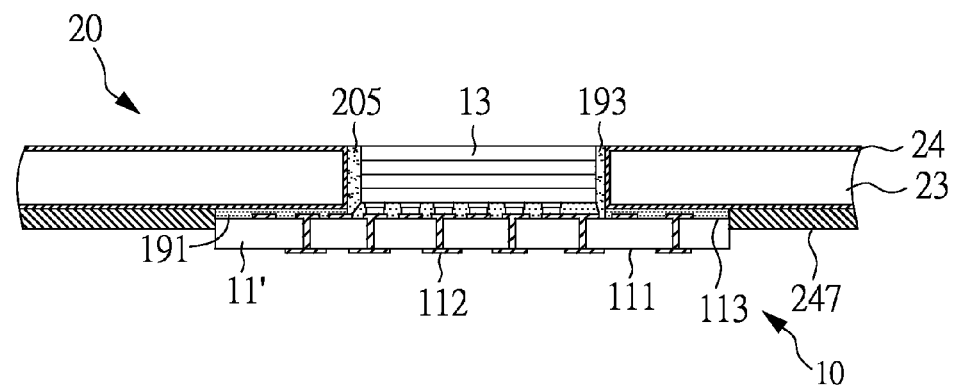
FIG. 26 is a cross-sectional view showing a state in which the structure of FIG. 25 is provided with a filler material in accordance with the third embodiment of the present invention.

FIG. 26 is a cross-sectional view of the structure provided with a filler material 193 in the remaining space of the through opening 205. The filler material 193 surrounds the semiconductor device 13 and is essentially coplanar with the semiconductor device 13 and the base carrier 20 in the upward direction.

Figure 27:
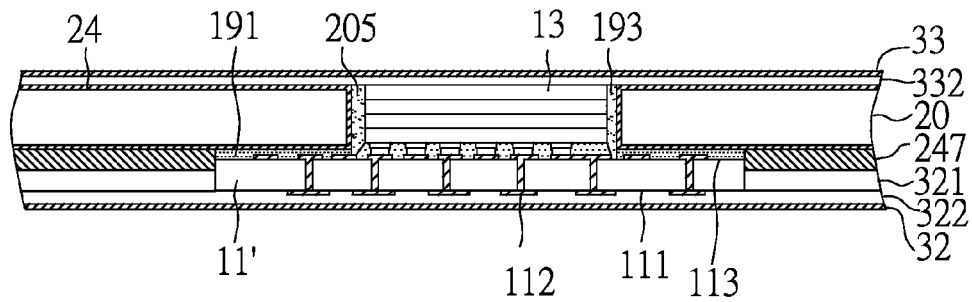
FIG. 27 is a cross-sectional view showing a state in which laminated layers are disposed on the structure of FIG. 26 in accordance with the third embodiment of the present invention.

FIG. 27 is a cross-sectional view of the structure with a balancing layer 321, a first insulating layer 322 and a first metal sheet 32 laminated/coated on the interposer 11' and the base carrier 20 from below, and a second insulating layer 332 and a second metal sheet 33 laminated/coated on the semiconductor device 13 and the base carrier 20 from above. The balancing layer 321 contacts and extends from the registration mark 247 of the base carrier 20 in the downward direction, laterally covers and surrounds and conformally coats the sidewalls of the interposer 11' and extends laterally from the interposer 11' to the peripheral edges of the structure. The first insulating layer 322 extends laterally on the first surface 111 of the interposer 11' and the balancing layer 321 and contacts and provides robust mechanical bonds between the first metal sheet 32 and the interposer 11' and between the first metal sheet 32 and the balancing layer 321. The second insulating layer 332 extends laterally on the semiconductor device 13 and the upper part of the conductive layer 24 of the base carrier 20 and contacts and provides robust mechanical bonds between the second metal sheet 33 and the base carrier 20 and between the second metal sheet 33 and the semiconductor device 13. In this embodiment, the first insulating layer 322 and the second insulating layer 332 typically has a thickness of 50 microns. The balancing layer 321 and the first and second insulating layers 322, 332 can be made of epoxy resin, glass-epoxy, polyimide, and the like. The first and second metal sheets 32, 33 in this embodiment each are a copper layer with a thickness of 25 microns.

Figure 28:
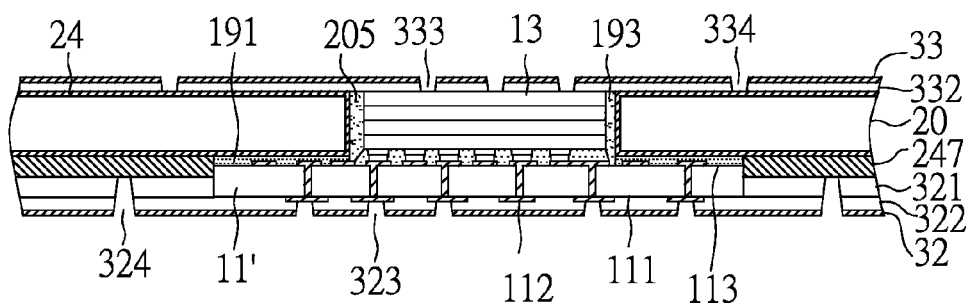
FIG. 28 is a cross-sectional view showing a state in which the structure of FIG. 27 is provided with via openings in accordance with the third embodiment of the present invention.

FIG. 28 is a cross-sectional view of the structure provided with first via openings 323, 324 and second via openings 333, 334. The first via openings 323 extend through the first metal sheet 32 and the first insulating layer 322 and are aligned with the first contact pads 112 of the interposer 11'. The additional first via openings 324 extend through the first metal sheet 32, the first insulating layer 322 and the balancing layer 321 and are aligned with the registration mark 247 of the base carrier 20. The second via openings 333 extend through the second metal sheet 33 and the second insulating layer 332 and are aligned with selected portions of the semiconductor device 13. The additional second via openings 334 extend through the second metal sheet 33, the second insulating layer 332 and are aligned with the upper part of the conductive layer 24 of the base carrier 20. The first and second via openings 323, 324, 333, 334 can be formed by any of numerous techniques including laser drilling, plasma etching and photolithography and typically have a diameter of 50 microns.

Figure 29:
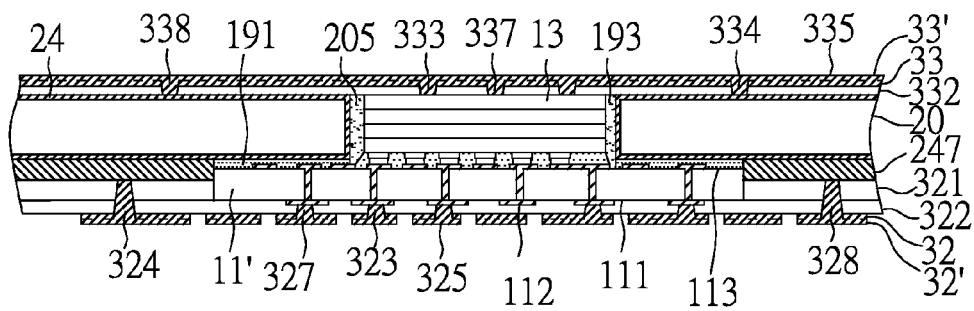
FIG. 29 is a cross-sectional view showing a state in which the structure of FIG. 28 is provided with conductive traces in accordance with the third embodiment of the present invention.

Referring now to FIG. 29, first conductive traces 325 are formed on the first insulating layer 322 by depositing a first plated layer 32' on the first metal sheet 32 and into the first via openings 323 and then patterning the first metal sheet 32 as well as the first plated layer 32' thereon. The first conductive traces 325 extend from the first contact pads 112 of the interposer 11' (or the registration mark 247) in the downward direction, extend laterally on the first insulating layer 322, and extend into and fill up the first via openings 323, 324 to form the first conductive vias 327, 328 in direct contact with the first contact pads 112 of the interposer 11' and the registration mark 247 of the base carrier 20, thereby providing signal routings for the interposer 11' and ground connection.

Also shown in FIG. 29 is a metal shield 335 in thermal connection with the semiconductor device 13 and electrical connection with the base carrier 20 by depositing a second plated layer 33' on the second metal sheet 33 and into the second via openings 333, 334 to form second conductive vias 337, 338 in thermal contact with the semiconductor device 13 for heat dissipation and in electrical contact with the upper part of the conductive layer 24 of the base carrier 20 for ground connection. The metal shield 335 extends from the second surface 133 of the semiconductor device 13 or the upper part of the conductive layer 24 of the base carrier 20 in the upward direction, laterally extends on the second insulating layer 332 to fill up the second via openings 333, 334, and is therefore thermally conductible to the semiconductor device 13 and electrically connected to the base carrier 20 through the second conductive vias 337, 338.

Figure 30:
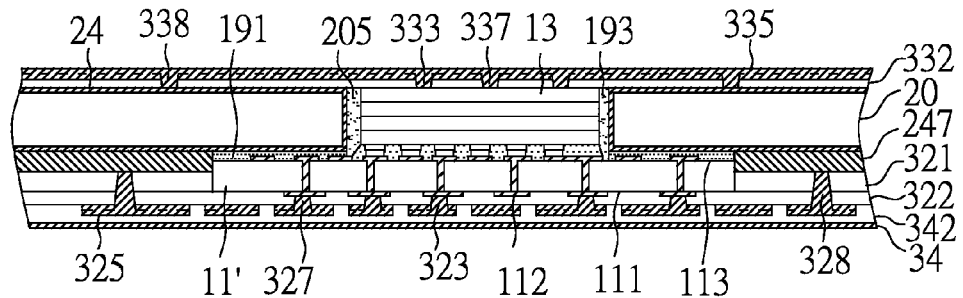
FIG. 30 is a cross-sectional view showing a state in which laminated layers are disposed on the structure of FIG. 29 in accordance with the third embodiment of the present invention.

FIG. 30 is a cross-sectional view of the structure with a third insulating layer 342 and a third metal sheet 34 laminated/coated on the first insulating layer 322 and the first conductive traces 325 from below. The third insulating layer 342 is sandwiched between the first insulating layer 322/the first conductive traces 325 and the third metal sheet 34. The third insulating layer 342 can be formed of epoxy resin, glass-epoxy, polyimide and the like and typically has a thickness of 50 microns. The third metal sheet 34 typically is a copper layer with a thickness of 25 microns.

Figure 31:
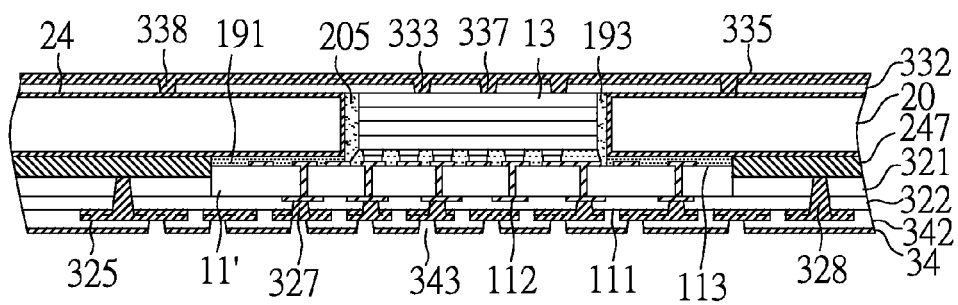
FIG. 31 is a cross-sectional view showing a state in which the structure of FIG. 30 is provided with via openings in accordance with the third embodiment of the present invention.

FIG. 31 is a cross-sectional view of the structure provided with the third via openings 343 to expose selected portions of the first conductive traces 325. The third via openings 343 extend through the third metal sheet 34 and the third insulating layer 342, and are aligned with selected portions of the first conductive traces 325. Like the first and second via openings 323, 324 333, 334, the third via openings 343 can be formed by any of numerous techniques including laser drilling, plasma etching and photolithography and typically have a diameter of 50 microns.

Figure 32:
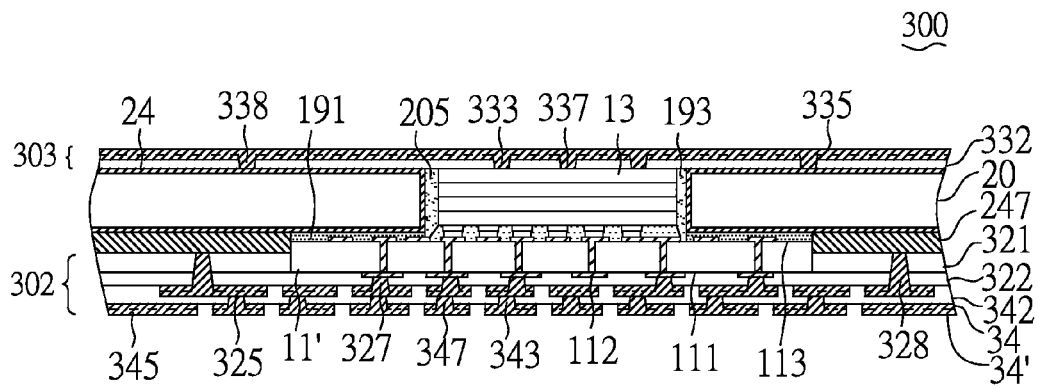
FIG. 32 is a cross-sectional view showing a state in which the structure of FIG. 31 is provided with conductive traces to finish the fabrication of a semiconductor assembly in accordance with the third embodiment of the present invention.

Referring now to FIG. 32, third conductive traces 345 are formed on the third insulating layer 342 by depositing a third plated layer 34' on the third metal sheet 34 and into the third via openings 343 and then patterning the third metal sheet 34 as well as the third plated layers 34' thereon. The third conductive traces 345 extend from the first conductive traces 325 in the downward direction, extend laterally on the third insulating layer 342 and extend into and fill up the third via openings 343 to form the third conductive vias 347 in direct contact with the first conductive traces 325.

Accordingly, as shown in FIG. 32, a semiconductor assembly 300 is accomplished and includes an interposer 11', a semiconductor device 13, a base carrier 20, a first buildup circuitry 302 and a second buildup circuitry 303. In this illustration, the first buildup circuitry 302 includes a balancing layer 321, a first insulating layer 322, first conductive traces 325, a third insulating layer 342 and third conductive traces 345; and the second buildup circuitry 303 includes a second insulating layer 332 and a metal shield 335. The semiconductor device 13 is electrically coupled to the prefabricated interposer 11' by flip chip process to form a chip-on-interposer subassembly 10. The chip-on-interposer subassembly 10 is attached to the base carrier 20 using an adhesive 191 with the semiconductor device 13 positioned within the through opening 205 and the interposer 11' laterally extending beyond the through opening 205. The registration mark 247 of the base carrier 20 extends beyond the second surface 113 of the interposer 11' in the downward direction and is in close proximity to the peripheral edges of the interposer 11' to provide critical placement accuracy for the interposer 11'. The first buildup circuitry 302 is electrically coupled to the interposer 11' through the first conductive vias 327 for signal routing. Further, the first buildup circuitry 302 is also electrically coupled to the base carrier 20 through the additional first conductive vias 328. As such, the metallic sidewalls of the through opening 205 can be electrically connected to the first buildup circuitry 301 for ground connection by the conductive layer 24 and the registration mark 247 in electrical contact with the conductive layer 24 and the first buildup circuitry 302, thereby providing horizontal EMI (electromagnetic interference) shielding for semiconductor device 13. The second buildup circuitry 303 is thermally conductible to the semiconductor device 13 and electrically coupled to the base carrier 20 through the second conductive vias 337, 338. As a result, the metal shield 335 of the second buildup circuitry 303 can provide thermal dissipation for the semiconductor device 13 by the second conductive vias 337 and also can be electrically connected to the first buildup circuitry 302 for ground connection by the second conductive vias 338, the conductive layer 24 and the registration mark 247 in electrical contact with the conductive layer 24 and the first buildup circuitry 302, thereby providing vertical EMI shielding for the semiconductor device 13.

Embodiment 4

FIGS. 33-43 are schematic views showing a method of making yet another semiconductor assembly in which the base carrier is fabricated from a laminate substrate in accordance with yet another embodiment of the present invention.

For purposes of brevity, any description in the aforementioned Embodiments is incorporated herein insofar as the same is applicable, and the same description need not be repeated.

Figure 33:
FIG. 33 is a cross-sectional view showing a laminate substrate in accordance with the fourth embodiment of the present invention.
Figure 34:
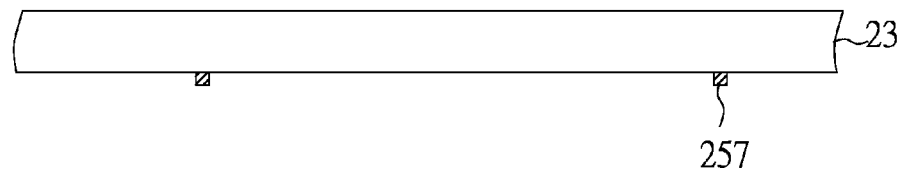
FIGS. 34 and 35 are cross-sectional and bottom perspective views, respectively, showing a state in which the laminate substrate of FIG. 33 is processed to form a registration mark in accordance with the fourth embodiment of the present invention.

FIGS. 33 and 34 are cross-sectional views showing a process of forming a registration mark on a dielectric layer in accordance with an embodiment of the present invention.

FIG. 33 is a cross-sectional view of a laminate substrate that includes a dielectric layer 23 and a metal layer 25. The dielectric layer 23 typically is made of epoxy resin, glass-epoxy, polyimide, and the like, and has a thickness of 0.5 mm in this embodiment. The metal layer 25 typically is made of copper, but copper alloys or other materials (such as aluminum, stainless steel or their alloys) may also be used. The thickness of the metal layer 25 can range from 5 to 200 microns. In this embodiment, the metal layer 25 is a copper plate with a thickness of 50 microns.

Figure 35:
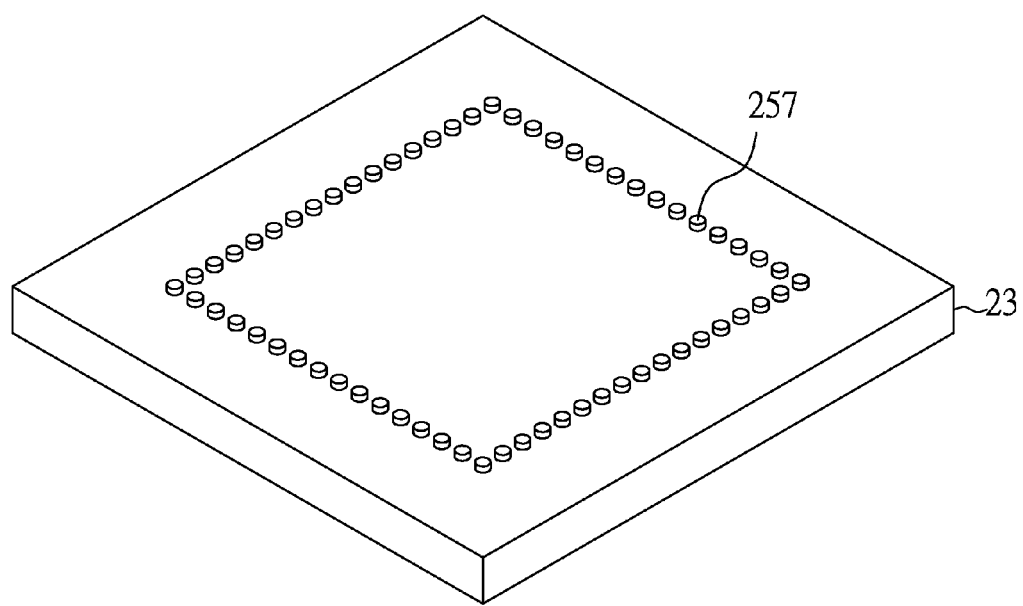

FIGS. 34 and 35 are cross-sectional and bottom perspective views, respectively, of the structure with a registration mark 257 formed on the dielectric layer 23. The registration mark 257 can be formed by removing selected portions of the metal layer 25 using photolithography and wet etching. As shown in FIG. 35, the registration mark 257 consists of plural metal posts in a rectangular frame array conforming to four lateral sides of a subsequently disposed interposer. However, the registration mark patterns are not limited thereto and can be in other various patterns against undesirable movement of the subsequently disposed interposer. For instance, the registration mark 257 may consist of a continuous or discontinuous strip and conform to four sides, two diagonal corners or four corners of a subsequently disposed interposer.

Figure 36:
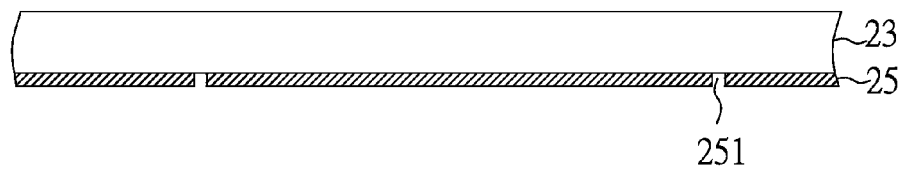
FIG. 36 is a cross-sectional view showing a laminate substrate with openings in accordance with the fourth embodiment of the present invention.
Figure 37:
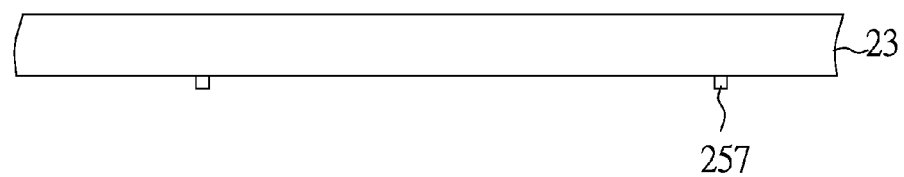
FIG. 37 is a cross-sectional view showing a state in which the laminate substrate of FIG. 36 is processed to form a registration mark in accordance with the fourth embodiment of the present invention.

FIGS. 36 and 37 are cross-sectional views showing an alternative process of forming a registration mark on a dielectric layer.

FIG. 36 is a cross-sectional view of a laminate substrate with a set of openings 251. The laminate substrate includes a dielectric layer 23 and a metal layer 25 as above mentioned, and the openings 251 are formed by removing selected portions of the metal layer 25.

FIG. 37 is a cross-sectional view of the structure with the registration mark 257 formed on the dielectric layer 23. The registration mark 257 can be formed by dispensing or printing a photosensitive plastic material (e.g., epoxy, polyimide, etc.) or non-photosensitive material into the openings 251, followed by removing the entire metal layer 25. Herein, the registration mark 257 consists of plural resin posts and has a pattern against undesirable movement of a subsequently disposed interposer.

Figure 38:
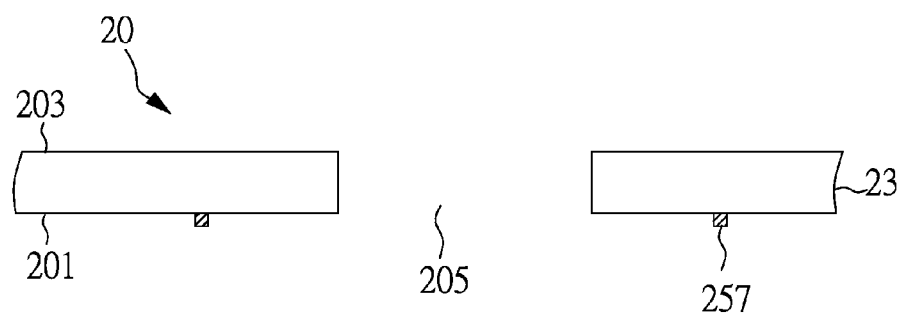
FIG. 38 is a cross-sectional view showing a state in which the laminate substrate of FIG. 34 is provided with a through opening to finish the fabrication of a base carrier in accordance with the fourth embodiment of the present invention.

FIG. 38 is a cross-sectional view of the base carrier 20 with a through opening 205. The through opening 205 can be formed by mechanical drilling and extends through the dielectric layer 23 between the first surface 201 and the second surface 203 in the vertical direction.

Figure 39:
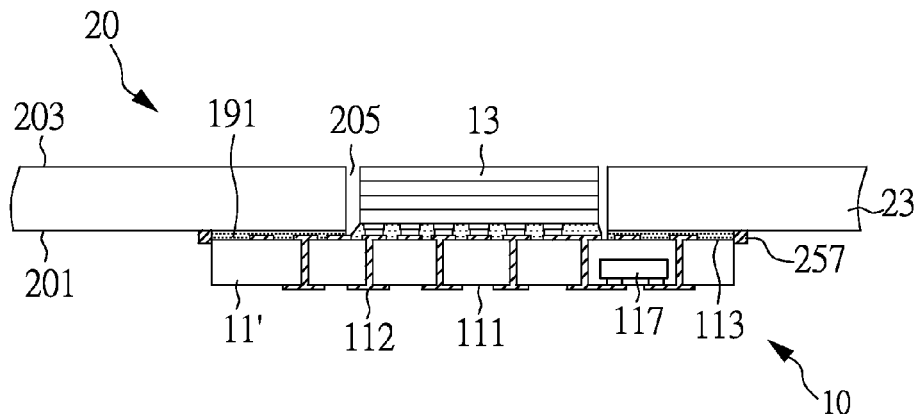
FIG. 39 is a cross-sectional view showing a state in which a chip-on-interposer subassembly is attached to the base carrier of FIG. 38 in accordance with the fourth embodiment of the present invention.

FIG. 39 is a cross-sectional view of the structure with a chip-on-interposer subassembly 10 attached to the base carrier 20 using an adhesive 191. The chip-on-interposer subassembly 10 is similar to that illustrated in FIG. 8, except that a single semiconductor device 13, illustrated as a 3D-stacked chip, is flip mounted on the interposer 11' and the interposer 11' further includes a passive component 117 embedded therein and electrically coupled to the first contact pads 112 in this embodiment. The semiconductor device 13 is positioned within the through opening 205, and the interposer 11' is located beyond the through opening 205 with its second surface 113 attached to the dielectric layer 23. The adhesive 191 contacts and is disposed between the second surface 113 of the interposer 11' and the first surface 201 of the base carrier 20. The registration mark 257 extends from the dielectric layer 23 and extends beyond the second surface 113 of the interposer 11' in the downward direction and is in close proximity to the peripheral edges of the interposer 11' to provide critical placement accuracy for the interposer 11'.

Figure 40:
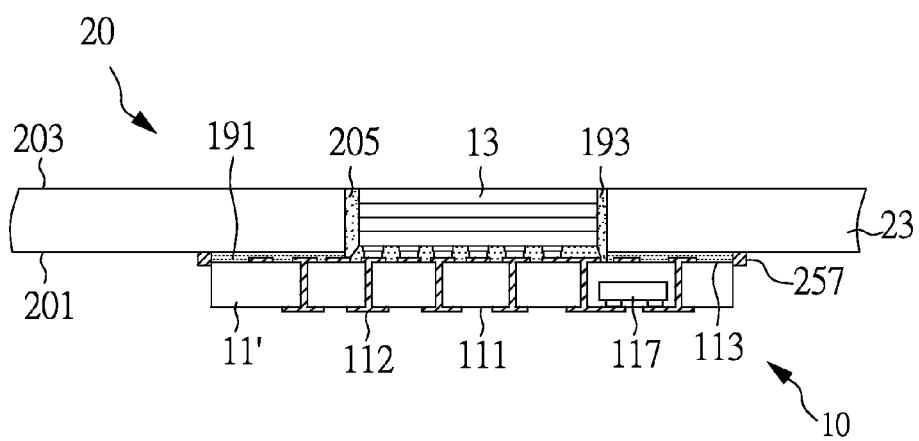
FIG. 40 is a cross-sectional view showing a state in which the structure of FIG. 39 is provided with a filler material in accordance with the fourth embodiment of the present invention.

FIG. 40 is a cross-sectional view of the structure provided with a filler material 193 in the remaining space of the through opening 205. The filler material 193 surrounds the semiconductor device 13 and is essentially coplanar with the semiconductor device 13 and the base carrier 20 in the upward direction.

Figure 41:
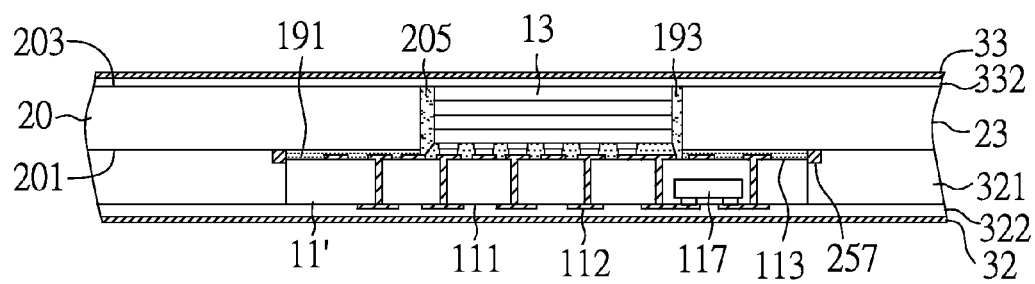
FIG. 41 is a cross-sectional view showing a state in which laminated layers are disposed on the structure of FIG. 40 in accordance with the fourth embodiment of the present invention.

FIG. 41 is a cross-sectional view of the structure with a balancing layer 321, a first insulating layer 322 and a first metal sheet 32 laminated/coated on the interposer 11' and the base carrier 20 from below, and a second insulating layer 332 and a second metal sheet 33 laminated/coated on the semiconductor device 13 and the base carrier 20 from above. The balancing layer 321 contacts and covers the dielectric layer 23 of the base carrier 20 and the sidewalls of the interposer 11'. The first insulating layer 322 extends laterally on the interposer 11' and the balancing layer 321 and contacts and provides robust mechanical bonds between the first metal sheet 32 and the interposer 11' and between the first metal sheet 32 and the balancing layer 321. The second insulating layer 332 extends laterally on the semiconductor device 13 and the second surface 203 of the base carrier 20 and contacts and provides robust mechanical bonds between the second metal sheet 33 and the semiconductor device 13 and between the second metal sheet 33 and the base carrier 20.

Figure 42:
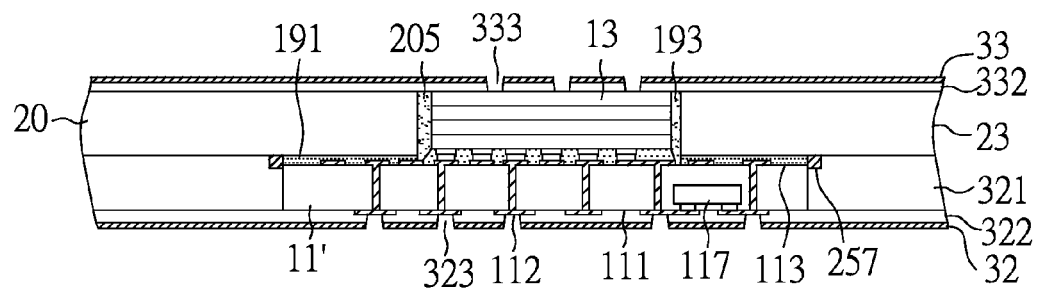
FIG. 42 is a cross-sectional view showing a state in which the structure of FIG. 41 is provided with via openings in accordance with the fourth embodiment of the present invention.

FIG. 42 is a cross-sectional view of the structure provided with first and second via openings 323, 333. The first via openings 323 extend through the first metal sheet 32 and the first insulating layer 322 and are aligned with the first contact pads 112 of the interposer 11'. The second via openings 333 extend through the second metal sheet 33 and the second insulating layer 332 and are aligned with selected portions of the semiconductor device 13.

Figure 43:
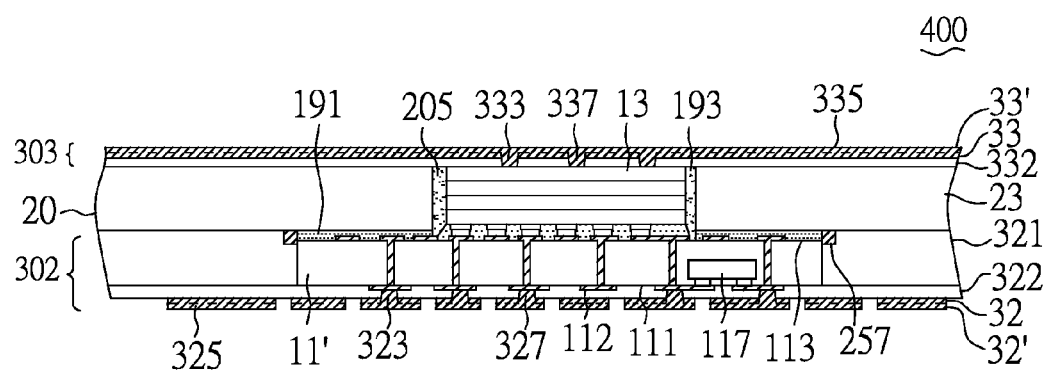
FIG. 43 is a cross-sectional view showing a state in which the structure of FIG. 42 is provided with conductive traces to finish the fabrication of a semiconductor assembly in accordance with the fourth embodiment of the present invention.

Referring now to FIG. 43, first conductive traces 325 are formed on the first insulating layer 322 by depositing a first plated layer 32' on the first metal sheet 32 and into the first via openings 323 and then patterning the first metal sheet 32 as well as the first plated layer 32' thereon. The first conductive traces 325 extend from the first contact pads 112 of the interposer 11' in the downward direction, extend laterally on the first insulating layer 322 and extend into and fill up the first via openings 323 to form the first conductive vias 327 in direct contact with the first contact pads 112 of the interposer 11', thereby providing signal routings for the interposer 11'.

Also shown in FIG. 43 is a metal shield 335 in thermal connection with the semiconductor device 13 by depositing a second plated layer 33' on the second metal sheet 33 and into the second via openings 333 to form second conductive vias 337 in thermal contact with the semiconductor device 13 for heat dissipation. The metal shield 335 extends from the inactive surface 133 of the semiconductor device 13 in the upward direction, laterally extends on the second insulating layer 332 to fill up the second via openings 333, and therefore is thermally conductible to the semiconductor device 13 through the second conductive vias 337.

Accordingly, as shown in FIG. 43, a semiconductor assembly 400 is accomplished and includes an interposer 11', a semiconductor device 13, a base carrier 20, a first buildup circuitry 302 and a second buildup circuitry 303. In this illustration, the first buildup circuitry 302 includes a balancing layer 321, a first insulating layer 322 and first conductive traces 325; and the second buildup circuitry 303 includes a second insulating layer 332 and a metal shield 335. The semiconductor device 13 is electrically coupled to the prefabricated interposer 11' by flip chip process to form a chip-on-interposer subassembly 10. The base carrier 20 includes a through opening 205 that extends through the dielectric layer 23. The chip-on-interposer subassembly 10 is attached to the base carrier 20 using an adhesive 191 with the semiconductor device 13 positioned within the through opening 205 and the interposer 11' laterally extending beyond the through opening 205. The registration mark 257 of the base carrier 20 extends from the dielectric layer 23 and extends beyond the second surface 113 of the interposer 11' in the downward direction and is laterally aligned with and in close proximity to the peripheral edges of the interposer 11' to provide critical placement accuracy for the interposer 11'. The first buildup circuitry 302 is electrically coupled to the interposer 11' through the first conductive vias 327 and provides fan out routing/interconnection. The second buildup circuitry 303 is thermally conductible to the semiconductor device 13 through the second conductive vias 337 for heat dissipation.

The assemblies described above are merely exemplary. Numerous other embodiments are contemplated. In addition, the embodiments described above can be mixed-and-matched with one another and with other embodiments depending on design and reliability considerations. The semiconductor device can share or not share the through opening with other semiconductor devices. For instance, a through opening can accommodate a single semiconductor device, and the base carrier can include multiple through openings arranged in an array for multiple semiconductor devices. Alternatively, numerous semiconductor devices can be positioned within a single through opening. Likewise, a semiconductor device can share or not share the interposer with other semiconductor devices. For instance, a single semiconductor device can be electrically connected to the interposer. Alternatively, numerous semiconductor devices may be coupled to the same interposer. For instance, four small semiconductor devices in a 2×2 array can be coupled to the interposer and the interposer can include additional contact pads to receive and route additional device pads. Also, the buildup circuitry can include additional conductive traces to accommodate additional contact pads of the interposer.

As illustrated in the aforementioned embodiments, a distinctive semiconductor assembly is configured to exhibit improved reliability, which includes a semiconductor device, an interposer, a base carrier, a first buildup circuitry, and optionally a cover sheet or a second buildup circuitry.

The semiconductor device is electrically coupled to the interposer by a plurality of bumps to form a chip-on-interposer subassembly. The semiconductor device can be a packaged or unpackaged chip. For instance, the semiconductor device can be a bare chip, or a wafer level packaged die, etc. Alternatively, the semiconductor device can be a 3D-stacked chip. Subsequently, the chip-on-interposer subassembly is attached to the base carrier using an adhesive that can be first dispensed on the first surface of the base carrier and then contacts the second surface of the interposer when inserting the semiconductor device into the through opening of the base carrier. Accordingly, the adhesive can provide mechanical bonds between the interposer and the base carrier. Optionally, a filler material can be further provided to fill the gap between the semiconductor device and the base carrier within the through opening.

The base carrier can extend to the peripheral edges of the semiconductor assembly and serves as a platform for the chip-on-interposer subassembly attachment. The base carrier preferably has a thickness of 0.1 mm to 1 mm and has a through opening with the same dimension at the first surface as at the second surface thereof. The base carrier may be made of metal materials, such as copper, aluminum, stainless steel or their alloys, but is not limited thereto. As such, the metallic base carrier can provide lateral EMI shields for the semiconductor device surrounded by the metallic sidewalls of the through opening. Alternatively, the base carrier may be made of non-metallic materials, such as various inorganic or organic insulating materials including ceramics, aluminum oxide ($Al_2O_3$), aluminum nitride (AlN), silicon nitride (SiN), silicon (Si), glass, laminated epoxy, polyimide copper-clad laminate or other dielectric materials. Optionally, the non-metallic base carrier may be deposited with a conductive layer (such as a copper layer) on sidewalls of the through opening as well as the first and second surfaces thereof. Accordingly, the through opening of base carrier can have metallic sidewalls to provide lateral EMI shielding effect for the semiconductor device within the through opening. In order to provide effective lateral EMI shielding, the metallic sidewalls of the base carrier preferably completely cover the lateral surfaces of the semiconductor device and are electrically connected to the first buildup circuitry for ground connection to minimize the lateral electromagnetic interference.

Moreover, the base carrier may include a registration mark on and projecting from its first surface for the interposer attachment. In a preferred embodiment, the registration mark extends from a flat surface of the base carrier and extends beyond the second surface of the interposer in the first vertical direction. For the convenience of description, the direction in which the first surface of the interposer faces is defined as the first vertical direction, and the direction in which the second surface of the interposer faces is defined as the second vertical direction. As such, the interposer placement accuracy can be provided by the registration mark that is laterally aligned with and in close proximity to the peripheral edges of the interposer.

The base carrier having a registration mark around one open end of the through opening can be fabricated by the steps of: forming a through opening in a metal plate; and forming a registration mark around one open end of the through opening by removing a selected portion of the metal plate or by pattern deposition of a metal or a plastic material on the metal plate. Also, the base carrier having a registration mark may be fabricated by the steps of: forming a registration mark on a dielectric layer by removing a selected portion of a metal layer on the dielectric layer or by pattern deposition of a metal or a plastic material on the dielectric layer; and forming a through opening that extends through the dielectric layer with the registration mark positioned around one open end of the through opening. Likewise, the non-metallic base carrier having a conductive layer on the sidewalls of the through opening as well as the first and second surfaces thereof can be provided with a registration mark on the conductive layer at the first surface thereof by a pattern deposition or pattern removal process as mentioned above.

The registration mark can be made of a metal, a photosensitive plastic material or non-photosensitive material. For instance, the registration mark can consist essentially of copper, aluminum, nickel, iron, tin or their alloys. The registration mark can also include or consist of epoxy or polyimide. Further, the registration mark can have various patterns against undesirable movement of the interposer. For instance, the registration mark can include a continuous or discontinuous strip or an array of posts. Alternatively, the registration mark may laterally extend to the peripheral edges of the base carrier and have inner peripheral edges that conform to the peripheral edges of the interposer. Specifically, the registration mark can be laterally aligned with four lateral surfaces of the interposer to define an area with the same or similar topography as the interposer and prevent the lateral displacement of the interposer. For instance, the registration mark can be aligned along and conform to four sides, two diagonal corners or four corners of the interposer, and the gaps in between the interposer and the registration mark preferably is in a range of about 5 to 50 microns. As a result, the registration mark located beyond the interposer can provide placement accuracy for the chip-on-interposer subassembly. Besides, the registration mark around the through opening preferably has a height in a range of 5-200 microns.

The interposer laterally extends beyond the through opening and can be attached to the base carrier with its second surface attached to a flat surface of the base carrier that is adjacent to and laterally extends from the first open end of the through opening. For the convenience of description, the open end of the through opening at the first surface of the base carrier is defined as the first open end, and the other open end of the through opening at the second surface of the base carrier is defined as the second open end. The interposer can be a silicon, glass, ceramic, graphite or resin material with a thickness of 50 to 500 microns, and can contain a pattern of traces that fan out from a finer pitch at the second contact pads to a coarser pitch at the first contact pads. Accordingly, the interposer can provide first level fan-out routing/interconnection for the semiconductor device. Additionally, as the interposer is typically made of a high elastic modulus material with CTE (coefficient of thermal expansion) approximately equal to that of the semiconductor device (for example, 3 to 10 ppm per degree Centigrade), internal stresses in chip and its electrical interconnection caused by CTE mismatch can be largely compensated or reduced. Further, the interposer may include one or more passive components embedded therein and electrically connected to the first contact pads of the interposer.

The first buildup circuitry covers and contacts the first surface of the interposer and the first surface of the base carrier in the first vertical direction and can provide secondary fan-out routing/interconnection. Besides, the first buildup circuitry can further be electrically coupled to the metallic surface of the base carrier by additional conductive vias for ground connection. The first buildup circuitry includes a balancing layer, a first insulating layer and one or more first conductive traces. The balancing layer laterally covers sidewalls of the interposer, and the first insulating layer is deposited on the first surface of the interposer and the balancing layer. The first conductive traces extend laterally on the first insulating layer and extend through first via openings in the first insulating layer to form first conductive vias in direct contact with the first contact pads of the interposer and optionally with the base carrier. Accordingly, the first conductive traces can directly contact the first contact pads to provide signal routing for the interposer, and thus the electrical connection between the interposer and the first buildup circuitry can be devoid of soldering material. Further, the first buildup circuitry may include additional insulating layers, additional via openings, and additional conductive traces if needed for further signal routing. The outmost conductive traces of the first buildup circuitry can accommodate conductive joints, such as solder balls, for electrical communication and mechanical attachment with the next level assembly or another electronic device such as a semiconductor chip, a plastic package or another semiconductor device.

The semiconductor assembly can optionally include a cover sheet or a second buildup circuitry to cover the exposed semiconductor device and the base carrier in the second vertical direction. In accordance with one aspect of the present invention, a cover sheet is attached on the semiconductor device and the second surface of the base carrier using an adhesive that contacts the semiconductor device and the cover sheet. The cover sheet can be a thermally conductive sheet such as a metal sheet and is attached on the semiconductor device and the base carrier preferably using a thermally conductive adhesive disposed between the semiconductor device and the cover sheet and between the base carrier and the cover sheet. As a result, the cover sheet can serve as a heat spreader to effectively dissipate the heat generated by the semiconductor device. Further, the cover sheet made of metal materials also can serve as a shielding lid to provide vertical EMI shields for the semiconductor device. Alternatively, the cover sheet may be made of a transparent material (such as glass) or color changing material for an optical device such as LEDs or imaging sensors. In accordance with another aspect of the present invention, a second buildup circuitry is formed on and contacts the semiconductor device and the second surface of the base carrier, and is thermally conductible to the semiconductor device for heat dissipation or/and is electrically coupled to the metallic surface of the base carrier for ground connection. The second buildup circuitry can include a second insulating layer and a metal shield. The second insulating layer is disposed on the semiconductor device and second surface of the base carrier. The metal shield extends laterally on the second insulating layer and preferably is a continuous metal layer that laterally extends to peripheral edges of the assembly. Further, the metal shield extends through second via openings in the second insulating layer to form second conductive vias in direct contact with the semiconductor device to provide thermal connections or with the metallic surface of the base carrier to provide electrical connections for ground connection. Accordingly, for the aspect of the second conductive vias in direct contact with the semiconductor device, the second conductive vias can serve as heat pipes to dissipate the heat generated from the semiconductor device to the metal shield of the second buildup circuitry. As for another aspect of the second conductive vias in direct contact with the base carrier, the metal shield can be electrically connected to the first buildup circuitry for ground connection by the second conductive vias and the base carrier in electrical connection with the first buildup circuitry so as to provide effective vertical EMI shielding. In order to provide effective vertical EMI shielding, the metal shield preferably laterally extends at least to a perimeter coincident with peripheral edges of the semiconductor device. For instance, the metal shield can laterally extend to be coplanar with peripheral edges of the semiconductor device in the lateral directions, or laterally extend beyond peripheral edges of the semiconductor device outward and even laterally extend to peripheral edges of the assembly. Accordingly, the metal shield that completely covers the semiconductor device from the second vertical direction can minimize the vertical electromagnetic interference.

The term "cover" refers to incomplete or complete coverage in a vertical and/or lateral direction. For instance, in the position that the first surface of the interposer faces the downward direction, the base carrier covers the interposer in the upward direction regardless of whether another element such as the adhesive is between the base carrier and the interposer.

The phrase "aligned with" refers to relative position between elements regardless of whether elements are spaced from or adjacent to one another or one element is inserted into and extends into the other element. For instance, the registration mark is laterally aligned with the interposer since an imaginary horizontal line intersects the registration mark and the interposer, regardless of whether another element is between the registration mark and the interposer and is intersected by the line, and regardless of whether another imaginary horizontal line intersects the interposer but not the registration mark or intersects the registration mark but not the interposer. Likewise, the first via opening is aligned with the first contact pads of the interposer.

The phrase "in close proximity to" refers to a gap between elements not being wider than a maximum acceptable limit. As known in the art, when the gap between the registration mark and the interposer is not narrow enough, the location error of the interposer due to the lateral displacement of the interposer within the gap may exceed the maximum acceptable error limit. In some cases, once the location error of the interposer goes beyond the maximum limit, it is impossible to align the predetermined portion of the interposer with a laser beam, resulting in the electrical connection failure between the interposer and the buildup circuitry. According to the pad size of the interposer, those skilled in the art can ascertain the maximum acceptable limit for a gap between the interposer and the registration mark through trial and error to ensure the conductive vias being aligned with the contact pads of the interposer. Thereby, the description "the registration mark is in close proximity to the peripheral edges of the interposer" means that the gap between the registration mark and the peripheral edges of the interposer is narrow enough to prevent the location error of the interposer from exceeding the maximum acceptable error limit.

The phrases "electrical connection", "electrically connected", "electrically coupled" and "electrically couples" refer to direct and indirect electrical connection. For instance, the first conductive traces directly contact and are electrically connected to the first contact pads of the interposer, and the third conductive traces are spaced from and electrically connected to the first contact pads of the interposer by the first conductive traces.

The "first vertical direction" and "second vertical direction" do not depend on the orientation of the assembly, as will be readily apparent to those skilled in the art. For instance, the first surface of the interposer faces the first vertical direction and the second surface of the interposer faces the second vertical direction regardless of whether the assembly is inverted. Likewise, the registration mark is "laterally" aligned with the interposer in a lateral plane regardless of whether the assembly is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the upward direction and the second vertical direction is the downward direction in the position that the first surface of the interposer faces the upward direction, and the first vertical direction is the downward direction and the second vertical direction is the upward direction in the position that the first surface of the interposer faces the downward direction.

The semiconductor assembly according to the present invention has numerous advantages. For instance, the semiconductor device is electrically coupled to the interposer by a well-known flip chip bonding process such as thermo-compression or solder reflow, which can avoid the positional accuracy issue inherent in most conventional approaches where an adhesive carrier is used for temporary bonding. The interposer provides a first level fan-out routing/interconnection for the semiconductor device whereas the buildup circuitry provides a second level fan-out routing/interconnection. As the buildup circuitry is formed on the interposer designed with larger pad size and pitch space, the manufacturing yield is greatly improved compared to the conventional types where buildup circuitry is directly formed on the chip I/O pad without fan-out routing. The base carrier can provide a platform for attaching the interposer thereon with the semiconductor device positioned in the through opening of the base carrier. The registration mark can provide critical placement accuracy for the interposer. As such, the shape of the through opening that houses the semiconductor device is not a critical parameter that needs to be tightly controlled. The direct electrical connection without solder between the interposer and the buildup circuitry is advantageous to high I/O and high performance. The buildup circuitry can provide signal routing with simple circuitry patterns or flexible multilayer signal routing with complex circuitry patterns. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and the description may simplify or omit elements or steps well-known to those skilled in the art to prevent obscuring the present invention. Likewise, the drawings may omit duplicative or unnecessary elements and reference labels to improve clarity.

What is claimed is:

1. A method of making a semiconductor assembly, comprising the steps of:
   providing a semiconductor device;
   providing an interposer that includes a first surface, a second surface opposite to the first surface, first contact pads on the first surface, second contact pads on the second surface, and through vias that electrically couple the first contact pads and the second contact pads;
   electrically coupling the semiconductor device to the second contact pads of the interposer by a plurality of bumps to form a chip-on-interposer subassembly;
   providing a base carrier having a first surface, an opposite second surface, a registration mark on and projecting from the first surface, and a through opening that extends through the base carrier between the first surface and the second surface thereof;
   attaching the chip-on-interposer subassembly to the base carrier using an adhesive with the semiconductor device inserted into the through opening and the interposer laterally extending beyond the through opening and with the registration mark laterally aligned with and in close proximity to peripheral edges of the interposer and extending beyond the second surface of the interposer; and
   with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry.

2. The method of claim 1, wherein the step of electrically coupling the semiconductor device to the second contact pads of the interposer is performed on a panel scale, and a singulation step is executed to separate individual chip-on-interposer subassemblies before the step of attaching the chip-on-interposer subassembly to the base carrier.

3. The method of claim 1, further comprising a step of attaching a cover sheet on the semiconductor device and the second surface of the base carrier.

4. The method of claim 1, further comprising a step of forming a second buildup circuitry on the semiconductor device and the second surface of the base carrier, wherein the second buildup circuitry is thermally conductible to the semiconductor device or electrically coupled to the base carrier through second conductive vias of the second buildup circuitry.

5. The method of claim 1, wherein the first buildup circuitry comprises additional first conductive vias for electrically coupling to the base carrier.

6. A semiconductor assembly prepared by a method that comprises steps of:
   providing a semiconductor device;
   providing an interposer that includes a first surface, a second surface opposite to the first surface, first contact pads on the first surface, second contact pads on the second surface, and through vias that electrically couple the first contact pads and the second contact pads;
   electrically coupling the semiconductor device to the second contact pads of the interposer by a plurality of bumps to form a chip-on-interposer subassembly;
   providing a base carrier having a first surface, an opposite second surface, a registration mark on and projecting from the first surface, and a through opening that extends through the base carrier between the first surface and the second surface thereof;
   attaching the chip-on-interposer subassembly to the base carrier using an adhesive with the semiconductor device inserted into the through opening and the interposer laterally extending beyond the through opening and with the registration mark laterally aligned with and in close proximity to peripheral edges of the interposer and extending beyond the second surface of the interposer; and
   with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry.

7. A semiconductor assembly, comprising:
   a semiconductor device;
   an interposer having a first surface, a second surface opposite to the first surface, first contact pads on the first surface, second contact pads on the second surface, and through vias that electrically couple the first contact pads and the second contact pads;
   a base carrier having a first surface, an opposite second surface, a registration mark on and projecting from the first surface thereof, and a through opening that extends through the base carrier between the first surface and the second surface thereof; and
   a first buildup circuitry formed on the first surface of the interposer and the first surface of the base carrier, wherein the first buildup circuitry is electrically coupled to the first contact pads of the interposer through first conductive vias of the first buildup circuitry,
   wherein the semiconductor device is electrically coupled to the second contact pads of the interposer by a plurality of bumps to form a chip-on-interposer subassembly;
   the chip-on-interposer subassembly is attached to the base carrier using an adhesive with the semiconductor device inserted into the through opening, the interposer laterally extending beyond the through opening, and
   the registration mark is laterally aligned with and in close proximity to peripheral edges of the interposer and extends beyond the second surface of the interposer.

8. The semiconductor assembly of claim 7, further comprising a cover sheet attached on the semiconductor device and the second surface of the base carrier.

9. The semiconductor assembly of claim 7, further comprising a second buildup circuitry formed on the semiconductor device and the second surface of the base carrier, wherein the second buildup circuitry is thermally conductible to the semiconductor device or electrically coupled to the base carrier through second conductive vias of the second buildup circuitry.

10. The semiconductor assembly of claim 7, wherein the first buildup circuitry comprises additional first conductive vias for electrically coupling to the base carrier.

11. The method of claim 1, wherein the first contact pads of the interposer are larger in pad size and pad spacing than the second contact pads of the interposer for the interposer to provide a fan-out routing for the semiconductor device.

12. The semiconductor assembly of claim 6, wherein the first contact pads of the interposer are larger in pad size and pad spacing than the second contact pads of the interposer for the interposer to provide a fan-out routing for the semiconductor device.

13. The semiconductor assembly of claim 7, wherein the first contact pads of the interposer are larger in pad size and pad spacing than the second contact pads of the interposer for the interposer to provide a fan-out routing for the semiconductor device.

\* \* \* \* \*